United States Patent
Zang et al.

(10) Patent No.: US 11,810,940 B2
(45) Date of Patent: Nov. 7, 2023

(54) POINTED-TRENCH PIXEL-ARRAY SUBSTRATE AND ASSOCIATED FABRICATION METHOD

(71) Applicant: OmniVision Technologies, Inc., Santa Clara, CA (US)

(72) Inventors: Hui Zang, San Jose, CA (US); Gang Chen, San Jose, CA (US)

(73) Assignee: OmniVision Technologies, Inc., Santa Clara, CA (US)

(*) Notice: Subject to any disclaimer, the term of this patent is extended or adjusted under 35 U.S.C. 154(b) by 117 days.

(21) Appl. No.: 17/080,797

(22) Filed: Oct. 26, 2020

(65) Prior Publication Data

US 2022/0130886 A1 Apr. 28, 2022

(51) Int. Cl.
*H01L 27/146* (2006.01)
*H01L 31/102* (2006.01)

(52) U.S. Cl.
CPC .. *H01L 27/14643* (2013.01); *H01L 27/14603* (2013.01); *H01L 31/102* (2013.01)

(58) Field of Classification Search
None
See application file for complete search history.

(56) References Cited

U.S. PATENT DOCUMENTS

| | | | |
|---|---|---|---|
| 7,804,130 B1 | 9/2010 | Fung | |
| 2010/0117126 A1* | 5/2010 | Takahashi | H01L 27/1463 257/292 |
| 2012/0161154 A1* | 6/2012 | Mimura | H01L 29/7813 257/77 |
| 2020/0381465 A1* | 12/2020 | Lin | H01L 27/14634 |
| 2021/0098515 A1* | 4/2021 | Ezaki | H01L 31/02 |
| 2021/0327947 A1* | 10/2021 | Lin | H01L 27/14614 |
| 2021/0343850 A1* | 11/2021 | Chi | H01L 29/42368 |
| 2022/0254819 A1* | 8/2022 | Sasaki | H01L 27/14689 |

FOREIGN PATENT DOCUMENTS

JP 2008235546 A * 10/2008 ......... H01L 29/0623

* cited by examiner

*Primary Examiner* — Nilufa Rahim
(74) *Attorney, Agent, or Firm* — COZEN O'CONNOR

(57) ABSTRACT

A pointed-trench pixel-array substrate includes a floating diffusion region and a photodiode region formed in a semiconductor substrate. The semiconductor substrate includes, between a top surface and a back surface thereof, a sidewall surface and a bottom surface defining a trench extending into the semiconductor substrate away from a planar region of the top surface surrounding the trench. In a cross-sectional plane perpendicular to the top surface and intersecting the floating diffusion region, the photodiode region, and the trench, (i) the bottom surface is V-shaped and (ii) the trench is located between the floating diffusion region and the photodiode region.

11 Claims, 15 Drawing Sheets

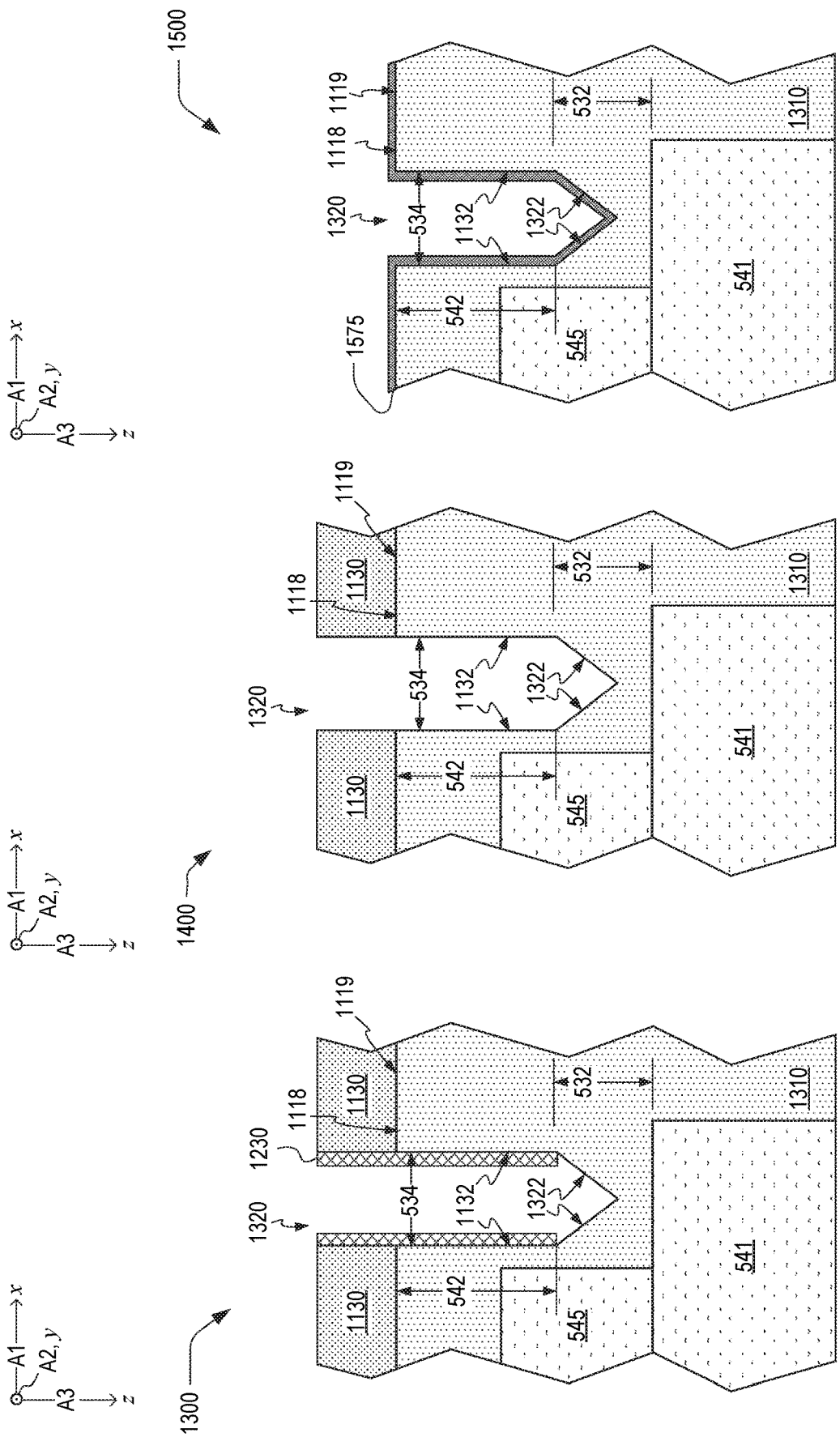

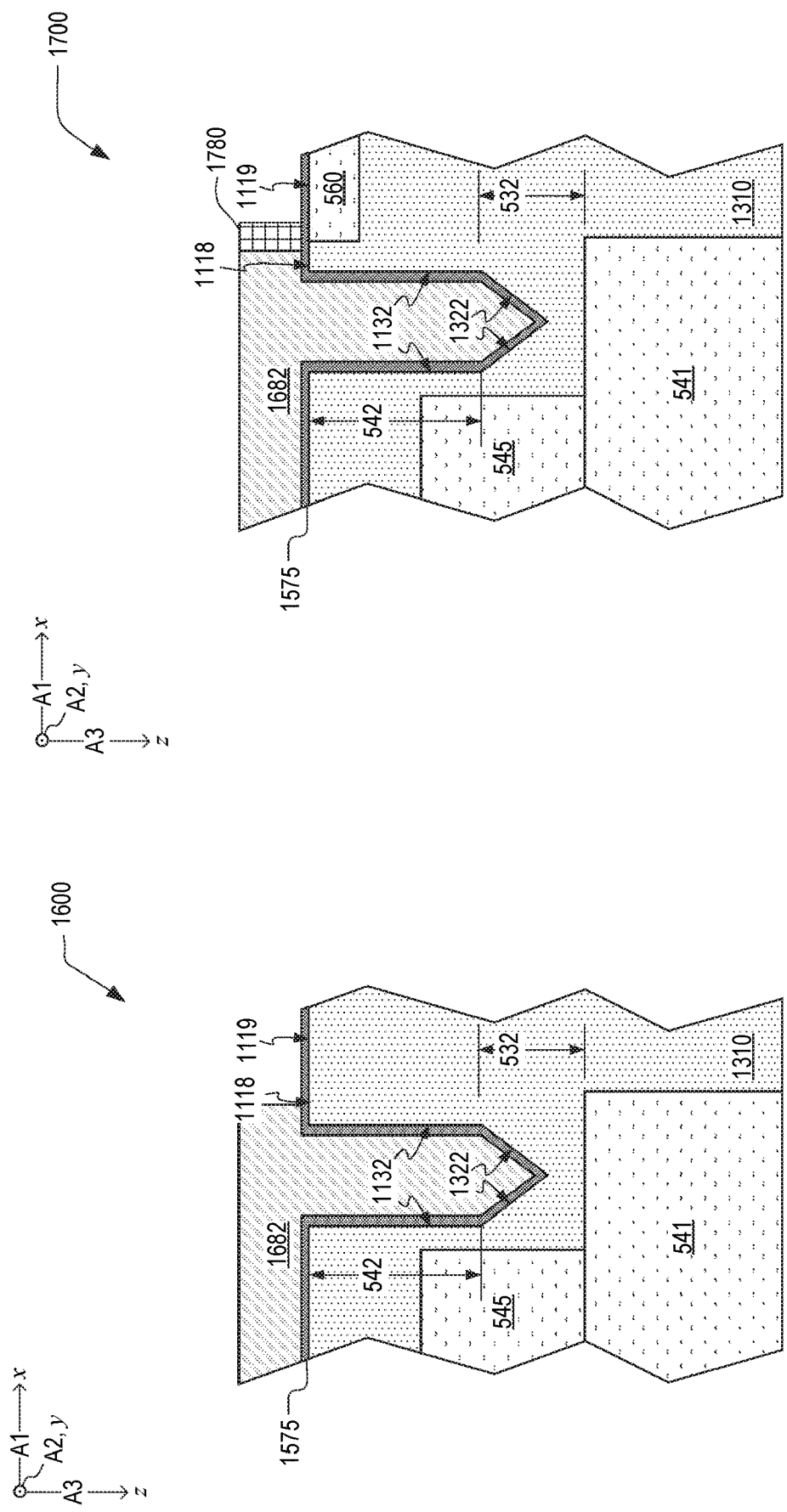

1800

1810
Etch a top surface of a semiconductor substrate to form a sidewall surface and an initial bottom surface of the semiconductor substrate that define a trench in the semiconductor substrate

1830
Extend a depth of the trench such that a final bottom surface of the trench is V-shaped in a cross-sectional plane that is perpendicular to the top surface.

1832
Line the sidewall surface with an oxide layer

1834
Isotropically etch a volume of the semiconductor substrate beneath the initial bottom surface

1840
Remove the oxide layer

1850
Form a dielectric layer on the final bottom surface, the sidewall surface, and part of a planar region of the top surface surrounding the trench

1870
Form a floating diffusion region in the semiconductor substrate.

1860
Deposit a conductive material in the trench and on part of the planar region to form a gate electrode

2710
Form a hole or an opening in a mask layer formed on an initial top surface of a semiconductor substrate, thereby exposing a region of the initial top surface.

2720
Etch the region to yield a recess in the initial top surface, a bottom surface of the recess being V-shaped in a cross-sectional plane that is perpendicular to the initial top surface.

2730
Fill the hole with a sacrificial-layer material.

2740
Remove the mask layer to yield a pillar formed of the sacrificial-layer material, protruding from the initial top surface.

2750
Increase a thickness of the semiconductor substrate by epitaxially forming, on the initial top surface, a semiconductor layer that surrounds the pillar.

2760
Remove the pillar to yield a trench extending into the semiconductor substrate.

2770
Form a photodiode region adjacent to the trench.

1850
Deposit a dielectric layer on the bottom surface.

1870
Form a floating diffusion region in the semiconductor substrate.

1860
Deposit a conductive material in the trench

FIG. 27

POINTED-TRENCH PIXEL-ARRAY SUBSTRATE AND ASSOCIATED FABRICATION METHOD

BACKGROUND

Camera modules in commercial products such as standalone digital cameras, mobile devices, automotive components, and medical devices include an image sensor and a pixel array thereof. The pixel array includes a plurality of pixels. A pixel array's pixel density is the number of pixels per unit area on the image sensor. In operation, the lens of a camera module forms an image, on the image sensor, of an object in its field of view. The object can be viewed as a plurality of infinitesimally small point-sources of illumination—"impulses"—incident on the camera. The lens images each of the plurality of impulses at a plane of the pixel array as a respective one of a plurality of point-spread functions—"impulse responses." The resolution of images captured by the image sensor depends in part on pixel size compared to the size of the impulse response. Accordingly, one way to increase a camera's maximum attainable resolution is to increase pixel density by decreasing pixel size. Motivation to decrease pixel sizes has led to development of pixels with vertical transfer gates.

Each pixel of the plurality of pixels includes a photodiode, a floating diffusion region, and a transfer gate. The transfer gate controls electron flow from the photodiode to the floating diffusion region and may be part of a field-effect transistor. Light reaching the photodiode generates photoelectrons. Turning on the transfer gate forms a conducting channel that allows the accumulated photoelectrons to transfer or flow from the photodiode to the floating diffusion region. When the transfer gate is pulsed to an off-state, the associated potential is lower than that of the photodiode raising a barrier in the corresponding energy band diagram to block electron flow from photodiode to floating diffusion region, hence preventing photoelectrons from flowing to the floating diffusion region.

In one common pixel architecture, the photodiode and the floating diffusion region are laterally displaced within the pixel, in a lateral direction parallel to a plane of the pixel array, with the transfer gate therebetween. This plane is horizontally orientated with respect to the vertical direction perpendicular thereto that defines the direction of normally-incident light (illumination) reaching the pixel array. Such a horizontal orientation limits how much the pixel density can be increased. Hence, one way to increase pixel density is to orient the photodiode, transfer gate, and floating diffusion region in a direction that has a vertical component. Such transfer gates are examples of vertical transfer gates.

SUMMARY OF THE EMBODIMENTS

One type of vertical transfer gate includes a gate electrode in a trench formed in a top surface of a silicon substrate that includes the pixel array. The trench has a bottom surface that is substantially parallel to the top surface. When the vertical transfer gate is on, the electric field beneath the bottom of the trench has only a vertical component, such that photoelectrons beneath the trench bottom surface are trapped beneath the trench. Surface roughness of the trench bottom surface formed due to etching process e.g., plasma etching also traps photoelectrons. Hence, the probability of these photoelectrons reaching the floating diffusion region in their lifetimes is very small. Electron transport lag refers to trapped photoelectrons that eventually reach the floating diffusion region, which result black dots in still images and ghost images in video. Embodiments disclosed herein remedy this problem.

In a first aspect, a pointed-trench pixel-array substrate includes a floating diffusion region and a photodiode region formed in a semiconductor substrate. The semiconductor substrate includes, between a top surface and a back surface thereof, a sidewall surface and a bottom surface defining a trench extending into the semiconductor substrate away from a planar region of the top surface surrounding the trench. In a cross-sectional plane perpendicular to the top surface and intersecting the floating diffusion region, the photodiode region, and the trench, (i) the bottom surface is V-shaped and (ii) the trench is located between the floating diffusion region and the photodiode region.

In a second aspect, a method for fabricating a pixel-array substrate includes etching a top surface of a semiconductor substrate to form a sidewall surface and an initial bottom surface of the semiconductor substrate that define a trench in the semiconductor substrate. The method also includes (i) lining the sidewall surface with an oxide layer and (ii) extending a depth of the trench such that a final bottom surface of the trench is V-shaped in a cross-sectional plane that is perpendicular to the top surface.

In a third aspect, a method for fabricating a pixel-array substrate includes forming a hole in a mask layer formed on an initial top surface of a semiconductor substrate, thereby exposing a region of the initial top surface. The method also includes etching the region to yield a recess in the initial top surface, a bottom surface of the recess being V-shaped in a cross-sectional plane that is perpendicular to the initial top surface.

BRIEF DESCRIPTION OF THE FIGURES

FIGS. 11-17 are schematic cross-sectional views of respective substrates formed in a process to fabricate any of the pixel-array substrates of FIGS. 4-6, 9, and 10, in embodiments.

FIG. 18 is a flowchart illustrating a first method for fabricating any of the pointed-trench pixel-array substrates of FIGS. 4-6, 9, and 10, in an embodiment.

FIG. 27 is a flowchart illustrating a second method for fabricating any of the pointed-trench pixel-array substrates of FIGS. 4-6, 9, and 10, in an embodiment.

DETAILED DESCRIPTION OF THE EMBODIMENTS

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the terms "below" and "under" may encompass both an orientation of above and below. The device may be otherwise oriented (rotated ninety degrees or at other orientations) and the spatially relative descriptors used herein interpreted accordingly. In addition, it will also be understood that when a layer is referred to as being "between" two layers, it may be the only layer between the two layers, or one or more intervening layers may also be present.

The term semiconductor substrate may refer to substrates formed using semiconductors such as silicon, silicon-germanium, germanium, gallium arsenide, and combinations thereof. The term semiconductor substrate may also refer to a substrate, formed of one or more semiconductors, subjected to previous process steps that form regions and/or junctions in the substrate. A semiconductor substrate may also include various features, such as doped and undoped semiconductors, epitaxial layers of silicon, and other semiconductor structures formed upon the substrate.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meanings.

Figure 1:
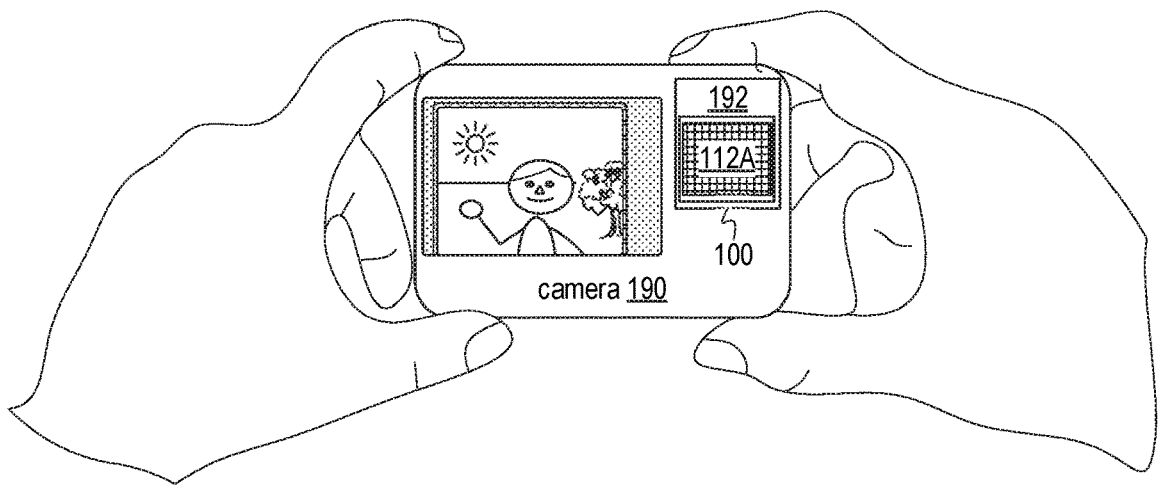
FIG. 1 depicts a camera imaging a scene.

FIG. 1 depicts a camera 190 imaging a scene. Camera 190 includes an image sensor 192, which includes a pixel-array substrate 100. Constituent elements of pixel-array substrate 100 may include at least one of silicon and germanium. Pixel-array substrate 100 includes a pixel array 112A. Image sensor 192 may part of a chip-scale package or a chip-on-board package.

Figure 2:
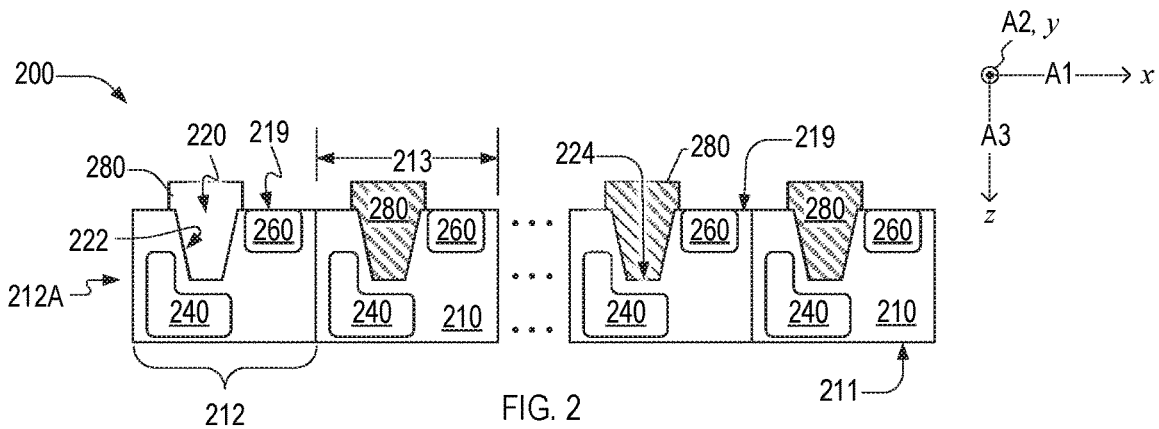
FIG. 2 is a cross-sectional schematic of a pixel-array substrate, which is an embodiment of the pixel-array substrate of the camera of FIG. 1.

FIG. 2 is a cross-sectional schematic of a pixel-array substrate 200, which is an example of pixel-array substrate 100 of image sensor 192. The cross-section illustrated in FIG. 2 is parallel to a plane, hereinafter the x-z plane, formed by orthogonal axes A1 and A3, which are each orthogonal to an axis A2. Herein, the x-y plane is formed by orthogonal axes A1 and A2, and planes parallel to the x-y plane are referred to as transverse planes. Unless otherwise specified, heights of objects herein refer to the object's extent along axis A3. Herein, a reference to an axis x, y, or z refers to axes A1, A2, and A3 respectively. Also, herein, a horizontal plane is parallel to the x-y plane, a width refers to an object's extent along the y axis, and a vertical direction is along the z axis.

Pixel-array substrate 200 includes a semiconductor substrate 210, which has a bottom substrate surface 211 and a top substrate surface 219, each of which may be perpendicular to direction A3. Herein, top substrate surface 219 may be referred to as the front side surface of semiconductor substrate 210 and bottom substrate surface 211 may be referred to as the backside surface of semiconductor substrate 210. Herein, top substrate surface 219 may be referred as the non-illuminated surface of semiconductor substrate 210 and bottom substrate surface 211 opposite to top substrate surface 219 may be referred to as the illuminated surface of semiconductor substrate 210.

Semiconductor substrate 210 includes a plurality of pixels 212 that form a pixel array 212A, which is an example of pixel array 112A. Pixels 212 are arranged in a plurality of rows and columns in directions A1 and A2 respectively. Pixel array 212A has a diagonal pixel pitch 213 in direction A1. In direction A2 pixel array 212A has pitch $P_y$ that, in embodiments, equals diagonal pixel pitch 213. In embodiments, diagonal pixel pitch 213 is less than 1.6 μm, for example, diagonal pixel pitch 213 may be between 1.0 μm to 3.0 μm, which corresponds to a range of standard pixel pitch between 0.7 μm to 2.0 μm.

Figure 3:
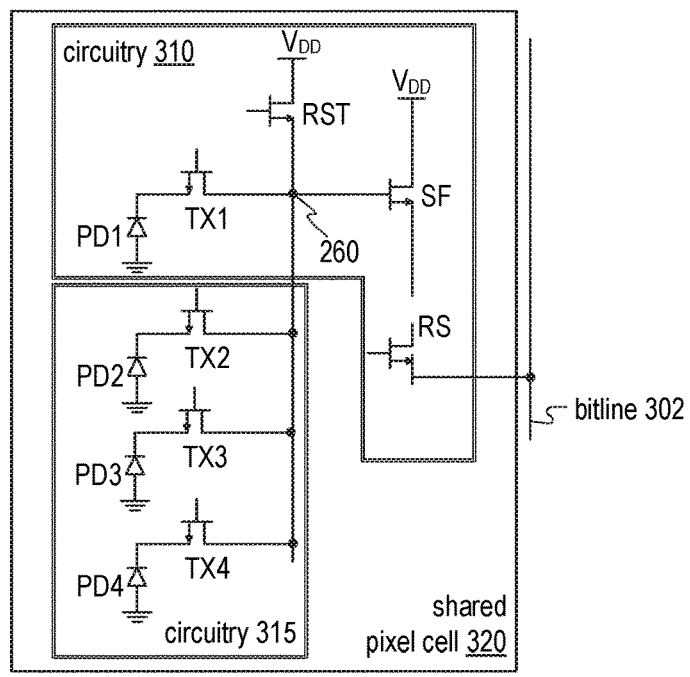
FIG. 3 is a circuit diagram of a shared pixel, which is a candidate pixel circuitry architecture of a pixel of FIG. 2.

FIG. 3 is a circuit diagram of a four-transistor ("4T") circuitry 310, which is a candidate pixel circuitry architecture of pixel 212. Pixel 310 includes a photodiode PD1, a transfer transistor TX1, a reset transistor RST, a source follower transistor SF, a row-select transistor RS. Circuitry 310 is electrically connected to a bitline 302 of image sensor 192. FIGS. 2 and 3 are best viewed together in the following description.

In embodiments, each pixel 212 is one of multiple pixels of a shared pixel cell. FIG. 3 depicts a pixel-cell circuitry 320, which is candidate pixel circuitry architecture for the shared pixel cell. Pixel-cell circuitry 320 includes circuitry 310 and circuitry 315. Circuitry 315 includes additional respective photodiodes PD2-PD4 and transfer transistors TX2-TX4 of three additional pixels of the shared pixel cell. Pixel circuitry 315 and circuitry 310 represent pixel circuitry for a shared pixel cell 320. Herein, transfer transistor TX refers to one of transfer transistors T1-T4.

Each pixel 212 includes a respective photodiode 240, a respective transfer transistor (e.g., transfer transistor TX) having vertical transfer gate 280, and a respective floating diffusion region 260. Photodiode 240 of each pixel 212 is at least partially buried in pixel-array substrate 200 and is configured to generate and accumulate charges in response to incident light (illumination) thereon, for example entered from bottom substrate surface 211 of semiconductor substrate 210 (e.g., backside surface of semiconductor substrate 210) during an integration period of the image sensor 192. Photodiode 240 is an example of any one of photodiodes PD1-PD4 of FIG. 3. In embodiments, photodiode 240 and floating diffusion region 260 are a source and a drain, respectively, of transfer transistor TX.

Electrical connection of photodiode 240 to floating diffusion region 260 depends on voltage applied to a transfer gate (e.g., vertical transfer gate 280) of the respective transfer transistor (e.g., transfer transistor TX) associated with pixel 212. Charges, e.g., photoelectrons, photo-generated and accumulated in photodiode 240 of respective pixel 212 can be selectively transferred to floating diffusion region 260 depending on voltage applied to the transfer gate (e.g., vertical transfer gate 280) of the respective transfer transistor associated with pixel 212, for example during a subsequent charge transfer period. The photodiode 240 may be in form of various configurations including pinned photodiode configuration, partially pinned photodiode configuration. In embodiments, charges accumulate in photodiode 240 during an integration period of image sensor 192.

A transfer gate (e.g., vertical transfer gate 280) of each transfer transistor (e.g., vertical gate electrode of transfer transistor TX1) is formed in a respective trench 220 defined by a side trench-surface 222 and a bottom trench-surface 224 of top substrate surface 219. As previously described, photoelectrons that travel beneath bottom trench-surface 224 become trapped because the electric field in this region has only a vertical component and surface roughness of bottom trench-surface 224 resulting from trench etching traps photoelectrons. Hence, most of photoelectrons in this region are blocked by vertical gate electrode 280 and few of these photoelectrons reach floating diffusion region 260.

In embodiments, each pixel 212 is a pixel unit in a shared pixel cell and each pixel cell further includes a reset transistor RST, a source follower transistor SF, and a row-select transistor RS shared by pixel 212 in the shared pixel cell. Reset transistor RST is coupled between a power line and floating diffusion region 260 to reset (e.g., discharge or charge floating diffusion region 260 to a preset voltage e.g., a supply voltage $V_{DD}$) under control of a reset signal during a reset period. Reset transistor RST is further coupled to photodiode 240 (e.g., one of photodiodes PD1-PD4) through the respective transfer transistor TX (e.g., transfer transistor TX1-TX4) to reset respective photodiode 240 to the preset voltage during the reset period. Floating diffusion region 260 is coupled to a gate of source follower transistor SF. The source follower transistor SF is coupled between the power line and row-select transistor RS. Source follower transistor SF operates to modulate the image signal output based on the voltage of floating diffusion region 260 received, where the image signal corresponds to the amount photoelectrons accumulated in photodiode 240 of each pixel during the integration period at the gate thereof. The row-select transistor RS selectively couples the output (e.g., image signal) of the source follower transistor RS to the readout column line (for example, bitline 302) under control of a row select signal.

In operation, during the integration period (also referred to as an exposure or accumulation period) of image sensor 192, photodiode 240 detects or absorbs light incident on pixel 212 and photogenerates charge. During the integration period, each of the transfer transistors TX1-TX4 is turned off, i.e., vertical transfer gate 280 of the respective transfer transistor TX1-TX4 receives a cut-off signal (e.g., a negative biasing voltage). The photogenerated charge accumulated in photodiode 240 is indicative of the amount of light incident on photodiode 240. After the integration period, each of the transfer transistors TX1-TX4 is turned on forming a conduction channel along the vertical transfer gate structure and transfers the photogenerated charge from photodiode 240 to floating diffusion region 260 through the conduction channel upon reception of a transfer signal (e.g., a positive biasing voltage) at vertical transfer gate 280 of transfer transistors TX1-TX4. The source follower transistor SF generates the image signal. The row-select transistor RS coupled to the source follower transistor then selectively reads out the signal onto a column bit line for subsequent image processing.

The disclosed vertical transfer gate structure is applied to a shared type pixel cell where the floating diffusion region is shared by multiple photodiodes, but may also apply to any of a variety of additional or alternative types of pixel cell, e.g. a four-transistor pixel cell, five-transistor pixel cell, or a six-transistor pixel cell.

Figure 4:
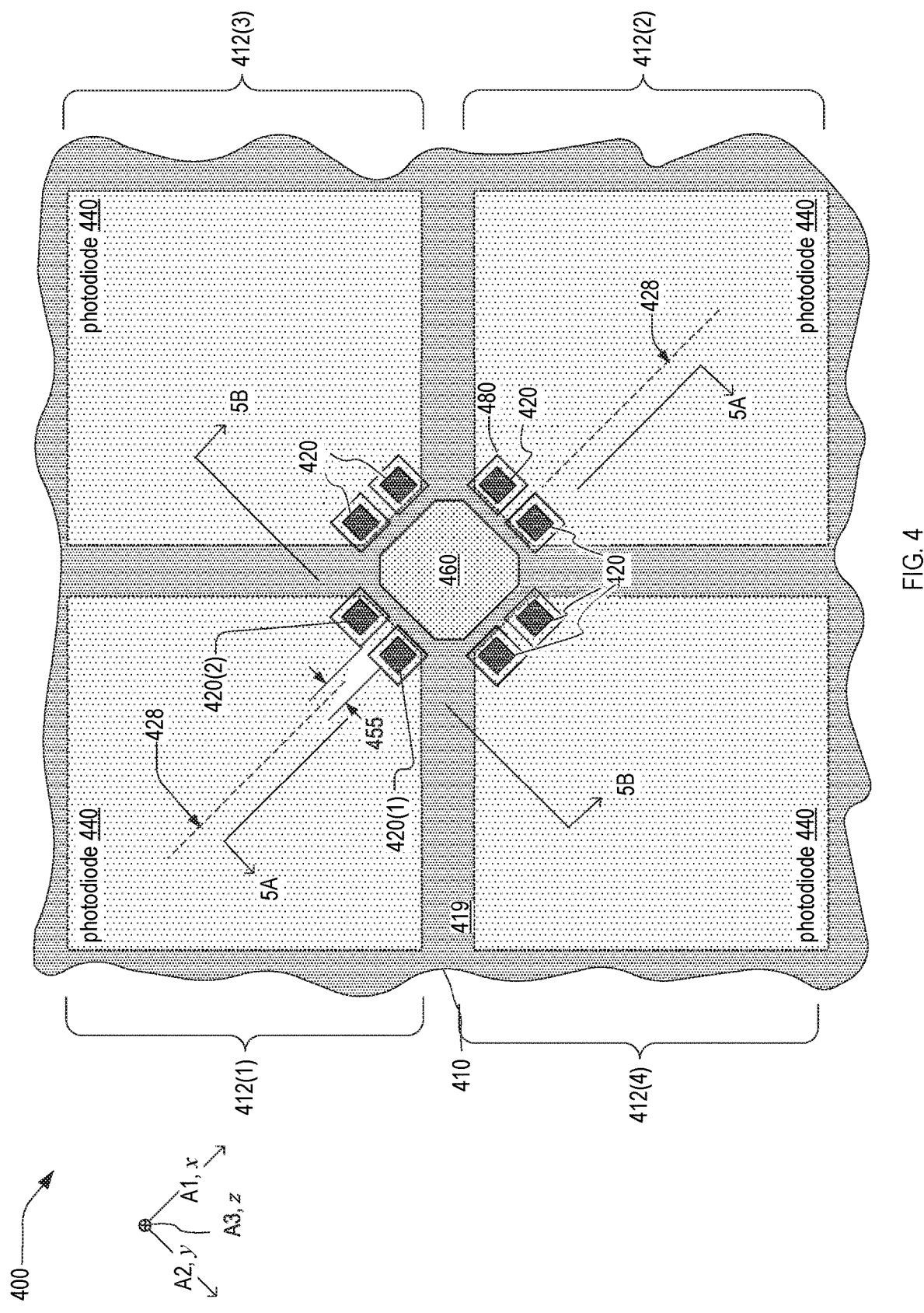
FIG. 4 is a cross-sectional schematic of a pointed-trench pixel-array substrate, which is an example of the pixel-array substrate of FIG. 2.

FIG. 4 is a cross-sectional schematic of a pointed-trench pixel-array substrate 400, which is an example of pixel-array substrate 200, FIG. 2. Pixel-array substrate 400 includes a semiconductor substrate 410 that includes trenches 420, photodiodes 440, and a floating diffusion region 460, which are examples of semiconductor substrate 210, trenches 220, photodiodes 440, and floating diffusion region 460, respectively. In embodiments, each trench 420 partially surrounds a respective transfer gate 480 denoted by a respective square around each trench 420. For clarity of illustration, not all transfer gates 480 are labeled with a reference numeral in FIG. 4.

FIG. 4 illustrates a shared pixel cell where multiple photodiodes, e.g., four photodiodes, share a common floating diffusion region. Restated, each of photodiode in the shared pixel cell transfer photo-generated charges to floating diffusion region 460. In the example of FIG. 4, photodiodes 440 are the multiple photodiodes and floating diffusion region 460 is the shared floating diffusion region.

Semiconductor substrate 410 has a top surface 419, which is an example of top substrate surface 219. Trenches 420 include a pair of trenches 420(1) and 420(2) separated by a constant distance 455 on top surface 419. FIG. 4 denotes a symmetry plane 428 that is perpendicular to the x-y plane and between trenches 420(1) and 420(2). Trenches 420(1) and 420(2) are symmetric with respect to symmetry plane 428.

FIG. 4 denotes cross-sectional planes 5A and 5B, each of which are parallel to the x-z plane and intersect at least two trenches 420. Cross-sectional plane 5A intersects photodiode region 440, floating diffusion region 460, and trench 420(1) therebetween. Cross-sectional plane 5B intersects trenches 420(1) and 420(2), and may be perpendicular to cross-sectional plane 5A.

In embodiments, pixel-array substrate 400 includes pixels 412(k), where k is a positive integer less than or equal to four. Pixels 412(k) form a two-by-two pixel array. Each pixel 412(k) includes photodiode 440 and at least one trench 420. Floating diffusion region 460 is common to each of pixels 412(1-4). Pixel 412 is an example of pixel 212, FIG. 2. While FIG. 4 illustrates each pixel 412 with a respective pair of trenches 420, embodiments of pixel-array substrate 400 may include a single trench 420 per pixel 412 without departing from the scope of the embodiments.

Herein, an element in the figures denoted by a reference numeral suffixed by a parenthetical numeral is an example of the element indicated by the reference numeral. Accordingly, and unless otherwise specified, a relationship between two elements with a suffix (m) also applies for those two elements with suffix (n≠m), where m and n are positive integers. While the following description refers to elements with parenthetical numeral (1), it may also apply to at least one of parenthetical numerals (2), (3), and (4). Attributes ascribed to pixel 412(1) or any elements thereof may also be respectively ascribed to one or more pixels 412(2-4) and any elements thereof.

Figure 5:
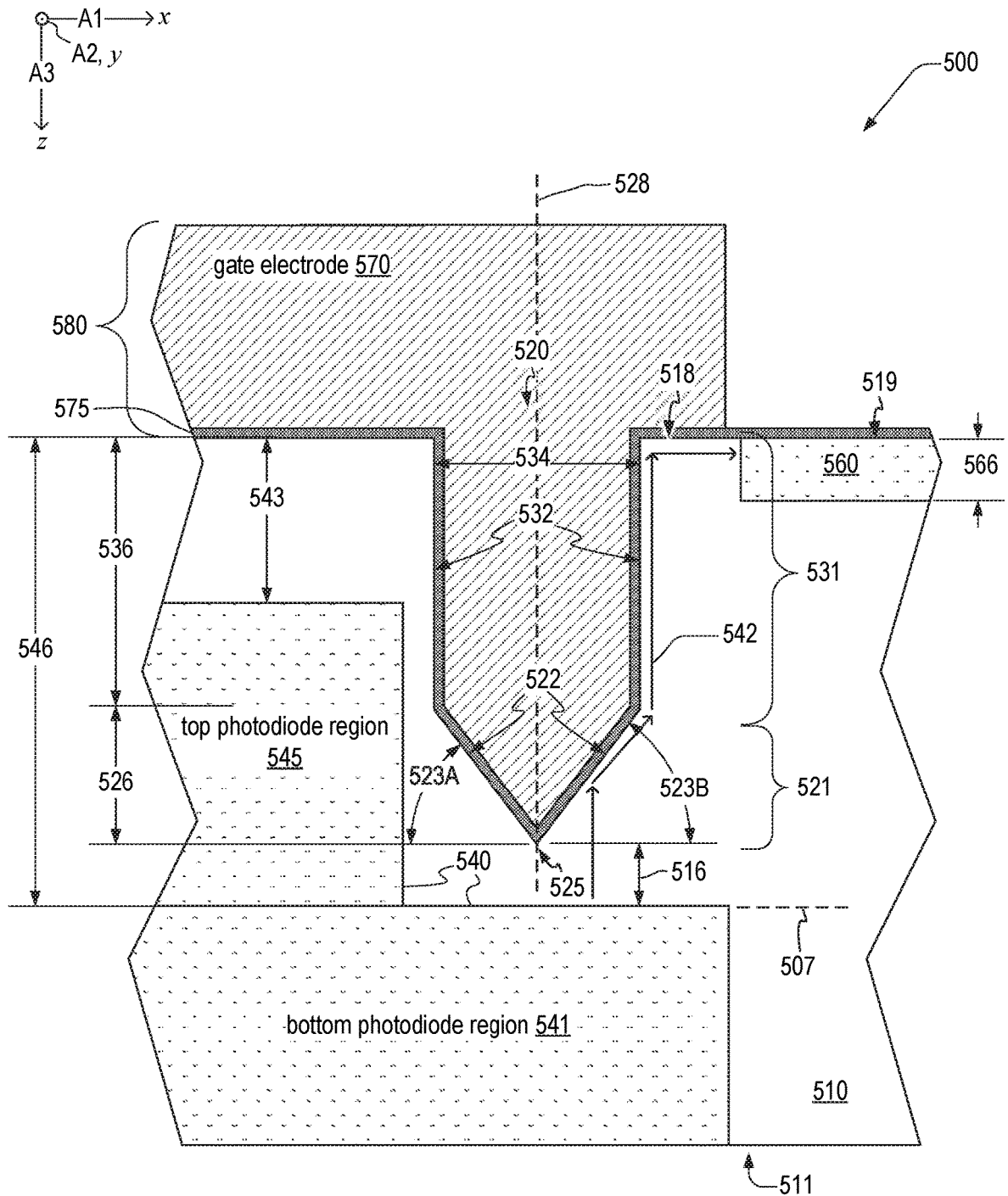
FIG. 5 is a cross-sectional view of a pointed-trench pixel-array substrate, which is an example of the pixel-array substrates of FIGS. 2 and 4.

FIG. 5 is a cross-sectional view of a pointed-trench pixel-array substrate 500. Pixel-array substrate 500 is an example of pixel-array substrate 200, FIG. 2, and an example of pixel-array substrate 400 in cross-sectional plane 5A.

Pixel-array substrate 500 includes a semiconductor substrate 510 and, formed therein, a photodiode region 540 and a floating diffusion region 560. Floating diffusion region 560 is an example of floating diffusion region 460. Semiconductor substrate 510 includes, between a top surface 519 and a back surface 511 thereof, a sidewall surface 532 and a bottom surface 522 defining a trench 520 extending into semiconductor substrate 510 away from a planar region 518 of top surface 519 surrounding trench 520. Trench 520 is located between floating diffusion region 560 and photodiode region 540. The x-z plane is perpendicular to top surface 519 and intersects floating diffusion region 560, photodiode region 540, and trench 520. In this cross-sectional plane, (i) bottom surface 522 is triangular or V-shaped and (ii) trench 520 is located between floating diffusion region 560 and photodiode region 540.

Bottom surface 522 and sidewall surface 532 define a bottom section 521 and a top section 531 of trench 520. Top section 531 has a width 534 and a depth 536 with respect to top surface 519. Width 534 may be a width of trench 520 at a boundary of sidewall surface 532 near planar region 518. Bottom section 521 has a depth 526 with respect to a bottom of top section 531. In embodiments, width 534 is between 0.05 micrometers and 0.3 micrometers. In embodiments, depth 536 is between 0.3 micrometers and 0.6 micrometers. Depth 526 of bottom section 521 extended from top section 531 is proportional to width 534 of top section 531.

FIG. 5 includes a plane 528 that intersects at nadir 525 of trench 520. Nadir 525 is located at a deepest point on surface 522 with respect to top surface 519. Plane 528 is parallel to the y-z plane. In embodiments, trench 520 is symmetric about plane 528, e.g. exhibiting mirror symmetry in the x-z plane about plane 528. For example, surface 522 may have the shape of a mold used to cast a cone, a four-sided pyramid, or a pentagonal-prism. Such center-oriented trench structure enables photogenerated electrons located at the region beneath vertical transfer gate 580 to move upward from any location and transfer to floating diffusion region 560 without being trapped.

Photodiode region 540 is an example of photodiode 240, FIG. 2, and includes a bottom photodiode region 541 beneath trench 520 and a top photodiode region 545 adjacent to trench 520. Bottom photodiode region 541 is formed at a photodiode depth 546 with respect to planar region 518. Bottom photodiode region 541 adjoins top photodiode region 545 at horizontal plane 507 and extends away from planar region 518 toward back substrate surface 511. Horizontal plane 507 is perpendicular to direction A3.

Bottom surface 522 includes sloped sides oriented at a respective angle 523A and 523B with respect to top surface 519. In embodiments, each of angles 523A and 523B is between fifty degrees and seventy degrees to enable photoelectrons formed beneath bottom photodiode region 541 to reach floating diffusion region 560 without being trapped. For example, FIG. 5 denotes a transfer path 542 of photoelectrons between bottom photodiode region 541, through a conduction channel formed around vertical transfer gate with V-shaped bottom surface (e.g., gate electrode 570), and to floating diffusion region 560 when vertical transfer gate 580 is biased.

In embodiments, depth 526 divided by width 534 is between 0.6 and 1.4 such that angles 523A and 523B are within the aforementioned range. Forming bottom section 521 with angles 523A and 523B that exceed seventy degrees requires one or both of increasing depth 526 or decreasing width 534, either of which could introduce costs, in terms of degraded performance of vertical transfer gate 280, that outweigh the marginal benefits of increasing angles.

Top photodiode region 545 is formed at a photodiode depth 543, with respect to planar region 518, that is less than trench depth 526 and extends toward back substrate surface 511 to horizontal plane 507. In embodiments, a lateral distance between the top photodiode region 545 and the trench of vertical transfer gate is between 30 nanometers and 300 nanometers. This range enables increased efficiency of charge transfer between photodiode region 540 and floating diffusion region 560. Depth 546 exceeds the sum of depths 526 and 536 by a distance 516. The V-shape of bottom surface 522 allows for distance 516 to be smaller than if bottom surface 522 were planar and parallel to planar region 518. In such cases, photoelectrons are trapped beneath surface 522 when distance 516 is less than 30 nanometers. In embodiments, distance 516 is between zero and thirty nanometers. The vertex of the bottom surface 522 of trench 520 may be in contact with the photodiode region 540.

In embodiments, semiconductor substrate 510 is p-type doped, photodiode region 540 is n-type doped, and floating diffusion region 560 is n$^+$-doped. In embodiments, floating diffusion region 560 has a dopant concentration between $10^{19}$ and $5 \times 10^{20}$ charge carriers per cubic centimeter. Floating diffusion region 560 is formed at a junction depth 566 with respect to planar region 518. In embodiments, junction depth 566 is less than trench depth 526 and photodiode depth 543. In other embodiments, the polarity may be reversed. For example, the semiconductor substrate 510 is n-typed doped, while photodiode region 540 and floating diffusion region 560 are p-type doped.

In embodiments, pixel-array substrate 500 also includes vertical transfer gate 580, which is an example of vertical transfer gate 280, FIG. 2. Vertical transfer gate 580 is electrically coupled to photodiode 540. Vertical transfer gate 580 includes a gate-electrode 570 and a dielectric layer 575. Gate-electrode 570 fills trench 520. Dielectric layer 575 lines both sidewall surface 532 and bottom surface 522 conformally such that dielectric layer 575 is between gate-electrode 570 and semiconductor substrate 510. In embodiments, gate-electrode 570 is formed of a conductive material such as polysilicon, a metal, or a combination thereof. In embodiments, dielectric layer 575 may be continuously extend onto top surface 519. Dielectric layer 575 may be formed of an oxide material.

Figure 6:
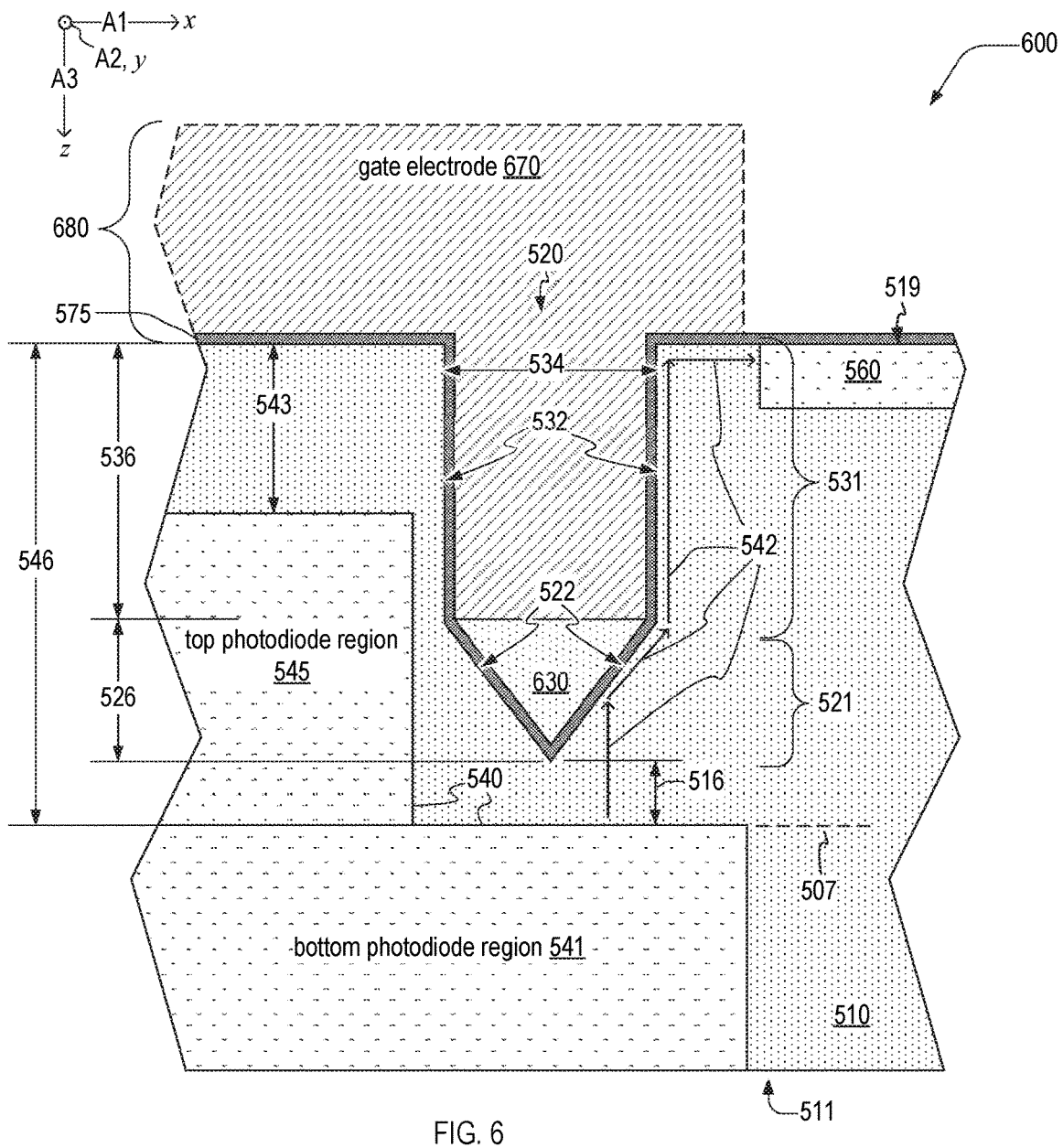
FIG. 6 is a cross-sectional view of a pointed-trench pixel-array substrate, which is an embodiment of pixel-array substrate of FIG. 5 with a low-κ dielectric layer in its trench, in an embodiment.

FIG. 6 is a cross-sectional view of a pointed-trench pixel-array substrate 600, which is an embodiment of pixel-array substrate 500 that includes a low-κ dielectric 630 on bottom surface 522 and having a maximum thickness substantially equal to depth 526 of bottom section 521. When pixel-array substrate 500 includes both dielectric layer 575 and a gate-electrode 670, low-κ dielectric 630 is between and gate-electrode 670 and dielectric layer 575, as illustrated in FIG. 6. Gate-electrode 670 and low-κ dielectric 630 form a transfer gate 680. Bottom section 521 with low-κ dielectric 630 is located deeper than photodiode region 545.

In pixel-array substrate 600, bottom section 521 functions as a capacitor with a low capacitance relative to regions of trench 520 above low-κ dielectric 630 and thereby inhibits vertical flow of photoelectrons between photodiode region 540 and gate-electrode material 570 near the bottom of trench 520, and hence prevents the aforementioned image artifacts associated with electron transport lag. Herein and per convention, a low-κ dielectric is a dielectric material that has dielectric constant κ<3.9, which is the dielectric constant of silicon dioxide. A high-κ dielectric is a dielectric material that has a dielectric constant greater than κ>7, which is the dielectric constant of silicon nitride. Examples of high-κ dielectrics include, but are not limited to, aluminum oxide ($Al_2O_3$), hafnium oxide $HfO_2$, tantalum oxide ($Ta_2O_5$), zirconium oxide $ZrO_2$ and combinations thereof.

Figure 7:
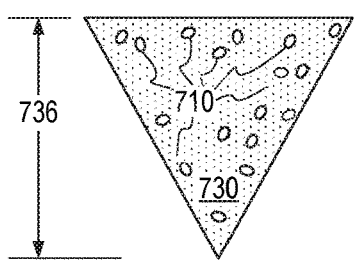
FIG. 7 is a schematic cross-sectional view of a first low-κ dielectric, which is an example of the low-κ dielectric of the pixel-array substrate of FIG. 6, in an embodiment.

FIG. 7 is a schematic cross-sectional view of a low-κ dielectric 730, which is an example of low-κ dielectric 630. Low-κ dielectric 730 has a thickness 736, which may equal depth 526. Low-κ dielectric 730 includes a plurality of pores 710, such that it is a porous dielectric. Pores 710 contribute to low-κ dielectric 730's qualifying as a low-κ dielectric, as the dielectric constant of air is effectively equal to one. Pores 710 may have an average diameter that is less than two nanometers. In embodiments, low-κ dielectric 730 includes at least one of micropores (pore widths less than two nanometers) and macropores (pore widths exceeding one hundred nanometers). In an embodiment, low-κ dielectric 730 is a porous material that includes a solid network and a gas filler. The solid network may be formed of at least one of silica, alumina, and titanium dioxide.

Figure 8:
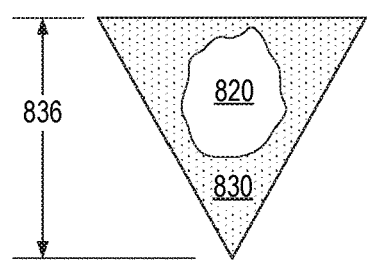
FIG. 8 is a schematic cross-sectional view of a second low-κ dielectric, which is an example of the low-κ dielectric of the pixel-array substrate of FIG. 6, in an embodiment.

FIG. 8 is a schematic cross-sectional view of a low-κ dielectric 830, which is an example of low-κ dielectric 630. Low-κ dielectric 830 has a thickness 836, which may equal depth 526. Low-κ dielectric 830 includes at least one air-gap 820 therein. Air gap 820 contributes to low-κ dielectric 830's qualifying as a low-κ dielectric, as the dielectric constant of air is effectively equal to one. Air gap 820 may have a diameter that exceeds one-half of thickness 836. In embodiments, low-κ dielectric 830 includes at least one pore 710. In embodiments, low-κ dielectric 730 includes at least one air-gap 820.

Figure 9:
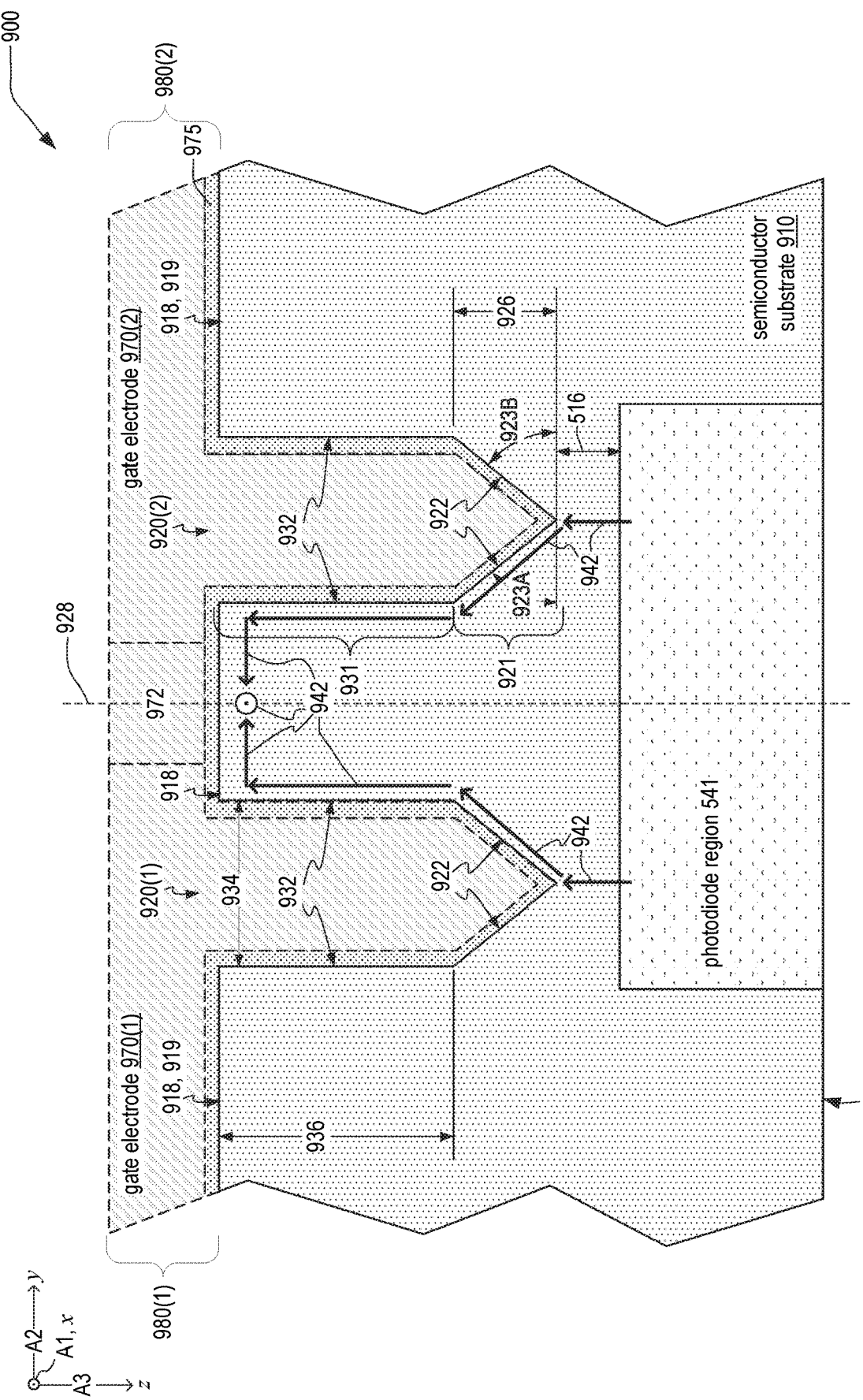
FIG. 9 is a cross-sectional view of a pointed-trench pixel-array substrate in a second cross-sectional plane of FIG. 4, in an embodiment.

FIG. 9 is a cross-sectional view of a pointed-trench pixel-array substrate 900 in cross-sectional plane 5B of FIG. 5. Pixel-array substrate 900 includes semiconductor substrate 910, which includes trenches 920(1) and 920(2). Pixel-array substrate 900, semiconductor substrate 910, and trenches 920 are respective examples of pixel-array substrate 500, semiconductor substrate 510, and trench 520, respectively. Trenches 920(1) and 920(2) are examples of trenches 420(1) and 420(2) of semiconductor substrate 410, FIG. 4, such that they are adjacent to the same one of photodiode regions 440. FIG. 9 denotes a plane 928 between trenches 920(1, 2), which is an example of symmetry plane 428, FIG. 4. Each trench 920 is an example of trench 520.

Semiconductor substrate 910 includes, between a top surface 919 and a back surface 911 thereof, a sidewall surface 932 and a bottom surface 922 defining trenches 920 extending into semiconductor substrate 910 away from a planar region 918 of top surface 919 surrounding trench 920. Part of planar region 918 is between two adjacent trenches 920. In embodiments, sidewall surface 932 and a bottom surface 922 are respective cross-sections of sidewall surface 532 and bottom surface 522 in cross-sectional plane 5B of FIG. 5 such that sidewall surfaces 532 and 932 are perpendicular cross-sections of the same surface and bottom surfaces 522 and 922 are perpendicular cross-sections of the same surface.

Bottom surface 922 and sidewall surface 932 define a bottom section 921 and a top section 931 of trench 920. Top section 931 has a width 934 and a depth 936. Bottom section 921 has a depth 926. Ranges of width 934 and depth 936, and depth 926 divided by width 934, are the same as those disclosed for width 534 and depth 536. In embodiments, depth 926 of bottom section 921 is related to, e.g., an increasing function of width 934 of top section 931.

In embodiments, pixel-array substrate 900 also includes at least one vertical transfer gate 980, which is an example of vertical transfer gate 280, FIG. 2. When switched on, vertical transfer gate 980 electrically connects photodiode 540 to a floating diffusion region (e.g., floating diffusion region 460). Each vertical transfer gate 980 includes a gate-electrode 970 and an oxide layer 975. Gate-electrode 970 fills each of trenches 920(1) and 920(2). Oxide layer 975 lines both sidewall surface 932 and bottom trench-surface 922 such that oxide layer 975 is between gate-electrode 970 and semiconductor substrate 910. In embodiments, gate-electrode 970 is formed of a conductive material such as polysilicon, a metal, or a combination thereof. In embodiments, gate electrodes 970(1) and 970(2) are electrically connected, for example, via additional gate-electrode layer 972 therebetween on oxide layer 975, and/or by a planar gate electrode on respective top surfaces 919. In such embodiments, gate electrodes 970(1, 2) are effectively a single gate electrode formed in both trenches 920(1) and 920(2). In embodiments, gate electrodes 970 and gate-electrode layer 972 are formed integrally in a same process step, and constitute a monolithic layer.

Semiconductor substrate 910 includes photodiode region 540 of semiconductor substrate 510. Only part of photodiode region 540 is visible in cross-sectional plane 5B: part of bottom photodiode region 541. Bottom surface 522 includes two sloped regions oriented at a respective angle 923A and 923B with respect to top surface 919. In embodiments, each of angles 923A and 923B is between fifty degrees and seventy degrees. This range of angles enable photoelectrons formed beneath bottom photodiode region 541 to reach a floating diffusion region (e.g., floating diffusion region 460, not shown in FIG. 9) electrically coupled thereto when vertical transfer gate 980 is switched on and forms a conduction channel along sidewall surfaces 932 between trenches 920(1) and 920(2). FIG. 9 denotes an example transfer path 942 for photoelectrons starting at bottom photodiode region 541, continuing along the conduction channel toward planar region 918 between trenches 920(1) and 920(2), and with a component along axis A1, extending toward floating diffusion region 560 in plane 928.

Figure 10:
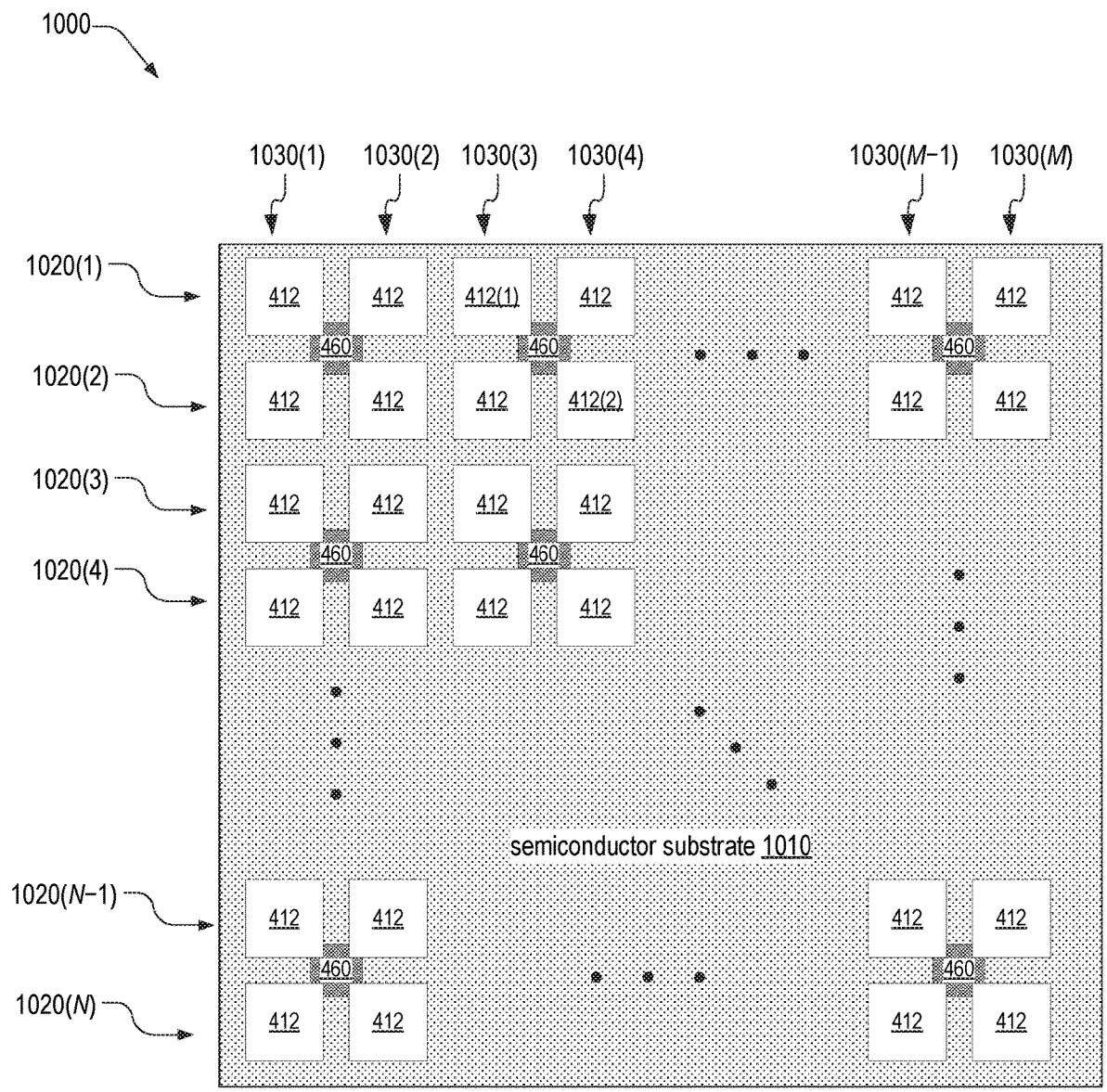
FIG. 10 is a schematic plan view of a pointed-trench pixel-array substrate, which is an example of the pixel-array substrate of FIGS. 4-6, and 9.

FIG. 10 is a schematic plan view of a pointed-trench pixel-array substrate 1000, which is an example of pixel-array substrates 400, 500, 600, and 900. Pixel-array substrate 1000 includes a plurality of rows 1020(1-N) of pixels 412 and a plurality of columns 1030(1-M) of pixels 412, where N and M are positive integers. Each pixel 412 is formed in a semiconductor substrate 1010, which is an example of semiconductor substrate 510. Pixel-array substrate 1000 includes a plurality of floating diffusion regions 460, each one of which is shared by, and part of each of four pixels 412 that form a two-by-two array. Each of the plurality of floating diffusion regions 460 is coupled to the four pixels 412 in the two-two array through respective transfer transistors with gate structure similar to transfer gate 580, transfer gate 680, or vertical transfer gates 980. Rows 1020 and columns 1030 form a two-dimensional M×N array of photodiodes in a detection plane parallel to a horizontal plane. Pixel 412(1) is in row 1020($n_1$) and a column 1030 ($m_1$) of the plurality of columns. Integers $n_1$ and $m_1$ are less than or equal to N and M, respectively. Pixel 412(2) is in an adjacent row 1020($n_1$±1) and in an adjacent column 1030 ($m_1$±1). FIG. 10 illustrates an example in which $n_1$=1 and $m_1$=3.

Figure 11:
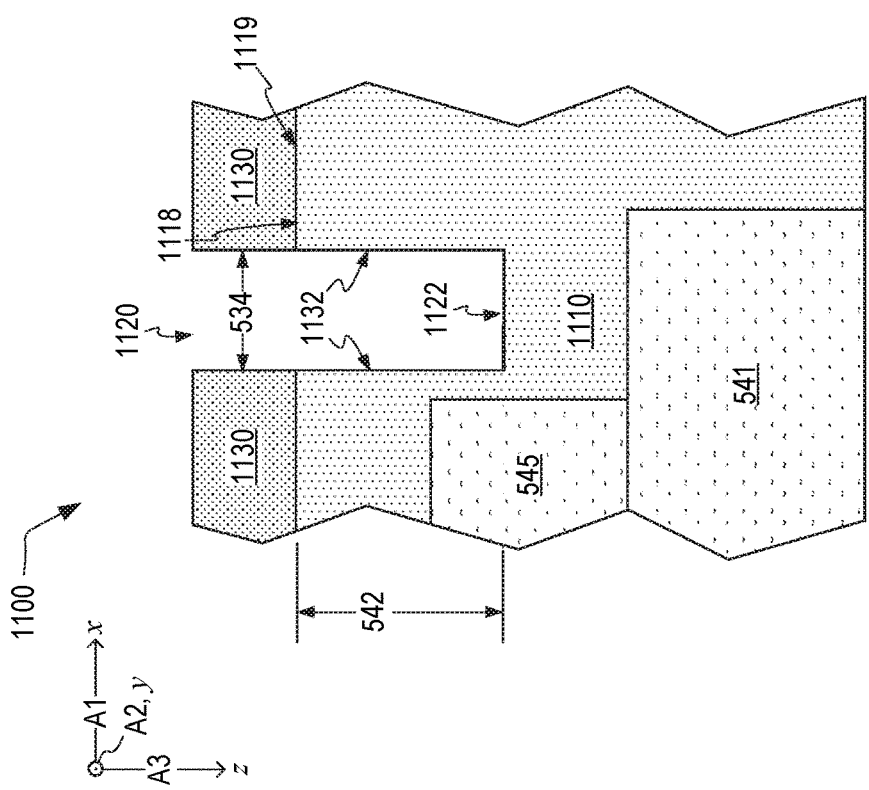

FIG. 11 is a cross-sectional schematic of an initial substrate 1100. FIGS. 12-17 are schematic cross-sectional views of respective intermediate substrates formed in a process to fabricate any of pointed-trench pixel-array substrates 400, 500, 600, 900, and 1000. The cross-sectional views of each of FIGS. 11-17 is in a plane parallel to the x-z plane.

FIG. 11 is a cross-sectional schematic of an initial substrate 1100, which includes a semiconductor substrate 1110 and a patterned mask 1130 thereon. Patterned mask 1130 may be formed of a nitride material. Semiconductor substrate 1110 includes a top surface 1119, a sidewall surface 1132, and an initial bottom surface 1122 that define a trench 1120 in semiconductor substrate 1110. Each trench 1120 is an example of trench 520. Top surface 1119 is an example of top surface 519, FIG. 5, and includes a planar region 1118. In embodiments, semiconductor substrate 1110 includes photodiode 540 having top photodiode region 545 and a bottom photodiode region 541 implanted adjacent to the trench 1120. The width and depth of trench 1120 are width 534 and depth 536, respectively, of trench 520, FIG. 5.

Figure 12:
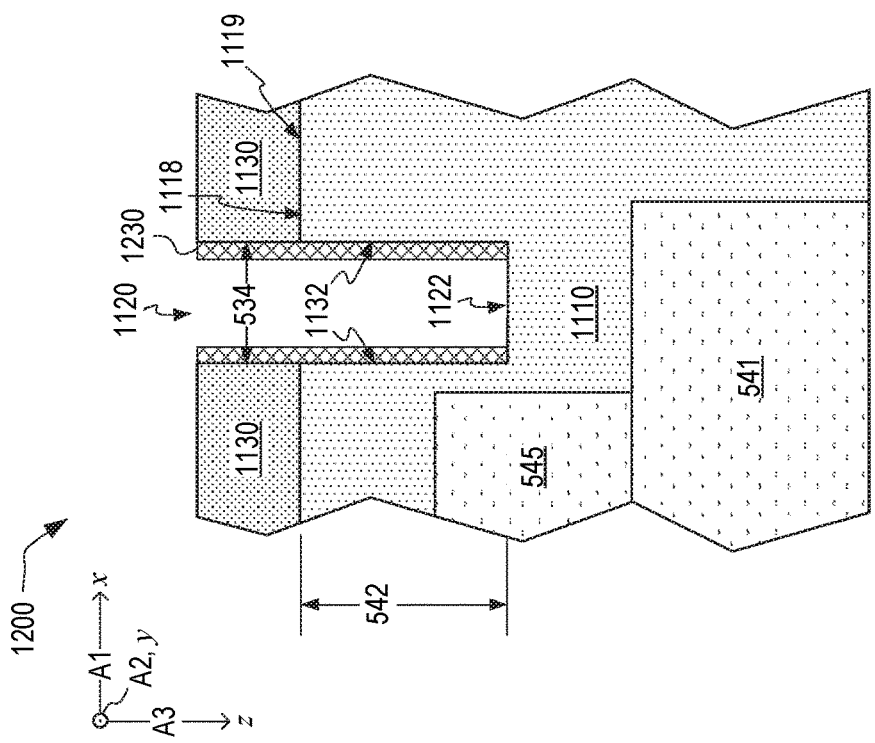

FIG. 12 is a cross-sectional schematic of an intermediate substrate 1200, which is initial substrate 1100 with the addition of a sidewall spacer layer 1230 coating sidewall surface 1132. In embodiments, sidewall spacer layer 1230 conformally coats on sidewall surface 1132 to protect sidewall surface 1132 during subsequent etching process. Sidewall spacer layer 1230 may be formed of an oxide or oxide-based material e.g. oxide-nitride. The thickness of sidewall spacer layer 1230 can range from 5 nanometers to 30 nanometers.

FIG. 13 is a cross-sectional schematic of an intermediate substrate 1300, which is intermediate substrate 1200 after removal of a volume of semiconductor substrate 1110 beneath initial bottom surface 1122 to yield a semiconductor substrate 1310. The presence of sidewall spacer layer 1230, during the wet etching process to remove a volume of semiconductor substrate 1110 beneath initial bottom surface 1122 prevents damage to sidewall surface 1132 of the trench, and hence yields smoother interface between trench sidewall surfaces 1132 and semiconductor substrate 1300. Semiconductor substrate 1310 includes sidewall surface 1122 and a final bottom surface 1322 that define a trench 1320 having a triangular or V-shaped cross-section at the bottom section in semiconductor substrate 1310. Final bottom surface 1322 is an example of bottom surface 522 of trench 520, FIG. 5. The use of wet etching further yields smoother bottom surfaces and has no silicon damages in comparison to dry plasma etching, thus no dark current noises associated with the bottom section of trench 520.

FIG. 14 is a cross-sectional schematic of a pixel-array substrate 1400, which is intermediate substrate 1300 after removal of sidewall spacer layer 1230. FIG. 15 is a cross-sectional schematic of a pixel-array substrate 1500, which is pixel-array substrate 1400 after formation of a dielectric layer 1575 on sidewall surface 1132 and final bottom surface 1322. Dielectric layer 1575 extends onto top surface 1119. Dielectric layer 1575 e.g., silicon oxide, may be formed through chemical vapor deposition or thermal oxidation on sidewall surface 1132 and final bottom surface 1322. The thickness of dielectric layer 1575 can range between thirty angstroms and 120 angstroms.

FIG. 16 is a cross-sectional schematic of a pixel-array substrate 1600, which is pixel-array substrate 1500 after deposition of a conductive material 1682 in trench 1320 and on part of planar region 1118 to form a gate electrode 1682. FIG. 17 is a cross-sectional schematic of a pixel-array substrate 1700, which is pixel-array substrate 1600 after formation of a spacer 1780 on sides of planar portion of gate electrode on top surface 1119 and floating diffusion region 560. Spacer 1780 may be formed of a nitride, and oxide, or a combination thereof.

FIG. 18 is a flowchart illustrating a method 1800 for fabricating a pixel-array substrate, such as any of pointed-trench pixel-array substrates 400, 500, 600, 900, and 1000. Method 1800 includes steps 1810 and 1830. In embodiments, method 1800 also includes at least one of steps 1840, 1850, 1860, and 1870.

Step 1810 includes etching a top surface of a semiconductor substrate to form a sidewall surface and an initial bottom surface of the semiconductor substrate that define a trench in the semiconductor substrate. The etching of step 1810 may be an anisotropic etching process. In an example of step 1810, top surface 1119 of semiconductor substrate 1110 is etched to form sidewall surface 1132 and initial bottom surface 1122, which define trench 1120.

Step 1830 includes extending a depth of the trench such that a final bottom surface of the trench is a triangular or V-shaped in a cross-sectional plane that is perpendicular to the top surface. In an example of step 1830, the depth of trench 1120 is extended to yield intermediate substrate 1130 and trench 1320 therein.

In embodiments, the semiconductor substrate includes a bottom photodiode region located in part beneath the final bottom surface. In such embodiments, step 1830 may include extending the depth until a distance between the final bottom surface and the bottom photodiode region is less than or equal to thirty nanometers. For example, FIG. 13 denotes distance 516 between final bottom surface 1322 and photodiode region 540.

In embodiments, step 1830 includes step 1832. Step 1832 includes lining the sidewall surface of the trench with a sidewall spacer layer to prevent etching damage to sidewall surface of the trench. In an example of step 1832, sidewall spacer layer 1230 is formed on sidewall surface 1132. Step 1832 may include filling the trench with an oxide-based material and subsequently removing part of the oxide-based material within trench 1120 to yield sidewall spacer layer 1230.

In embodiments, the sidewall surface extends into the semiconductor substrate away from a planar region of the top surface surrounding the trench to the final bottom surface. In such embodiments, step 1830 may include a step 1834 of isotropically etching, for example wet etching, the initial bottom surface to remove a volume of the semiconductor substrate therebeneath without cause damages to lattice structure and yield smoother bottom trench surface. In an example of step 1834, initial bottom surface 1122 is etched to remove a volume of semiconductor substrate 1110 therebeneath to yield trench 1320.

Step 1840 includes removing the sidewall spacer layer. In an example of step 1840, sidewall spacer layer 1230 is entirely removed from sidewall surface 1132 to yield pixel-array substrate 1400, FIG. 14.

Step 1850 includes forming a dielectric layer on the final bottom surface, the sidewall surface, and part of a planar region of the top surface surrounding the trench. The dielectric layer may be formed by a thermal oxidation process. In an example of step 1850, dielectric layer 1575 is deposited on final bottom surface 1322, sidewall surface 1132, and part of planar region 1118 of pixel-array substrate 1400 to yield pixel-array substrate 1500.

Step 1860 includes depositing a conductive material in the trench and on part of the planar region to form a gate electrode. Step 1860 may also include etching to remove excess conductive material. In embodiments, step 1860 is applied to pixel-array substrate 1500 after removal of patterned mask 1130 therefrom, such that conductive material 1682 is deposited in trench 1320 and on part of planar region 1118 of pixel-array substrate 1500 to yield pixel-array substrate 1600, FIG. 16.

In embodiments, after step 1850, a layer of low-κ dielectric is deposited into the trench and on the dielectric layer. Thereafter, the conductive material of step 1860 is deposited into the trench on the low-κ dielectric. For example, low-κ dielectric 630 is deposited into the trench 1320 onto dielectric layer 1575 prior to the deposition of conductive material 1682.

In embodiments, the semiconductor substrate includes a top photodiode region beneath the top surface and on a first side of the trench in the cross-sectional plane. The top photodiode region adjoins the bottom photodiode region. Step 1870 includes forming a floating diffusion region in the semiconductor substrate, by ion implantation, for example. The top photodiode region, and the floating diffusion region are on opposite sides of the trench in the cross-sectional plane. In embodiments, the top photodiode region, the bottom photodiode region, and the floating diffusion region are of same conductive type opposite to the conductive type of semiconductor substrate. In a first example of step 1870, floating diffusion region 560 is formed in semiconductor substrate 1310 of pixel-array substrate 1600 to yield pixel-array substrate 1700, FIG. 17. In a second example of step 1870, floating diffusion region 560 is formed in semiconductor substrate 1310 of pixel-array substrate 1500, after removal of patterned mask 1130 therefrom.

Figure 19:
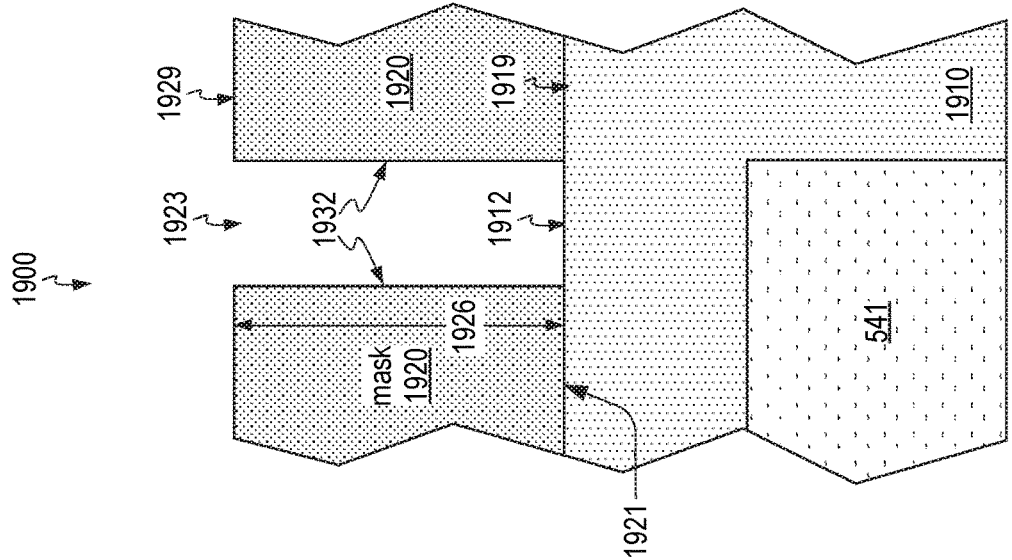

FIG. 19 is a cross-sectional schematic of an initial substrate 1900. FIGS. 20-26 are schematic cross-sectional views of respective intermediate substrates formed in a process to fabricate any of pixel-array substrate 400, 500, 600, 900, and 1000.

Initial substrate 1900 includes a semiconductor substrate 1910 and a patterned mask 1920 thereon. Semiconductor substrate 1910 includes an initial top surface 1919 and bottom photodiode region 541. Patterned mask 1920 has a thickness 1926 and may be formed of a nitride material, such as silicon nitride. In embodiments, thickness 1926 is between 0.3 micrometers and 0.6 micrometers. Patterned mask 1920 has a bottom surface 1921, a top surface 1929, and a sidewall surface 1932 therebetween that defines a hole 1923 through patterned mask 1920 that exposes a region 1912 of initial top surface 1919.

Figure 20:
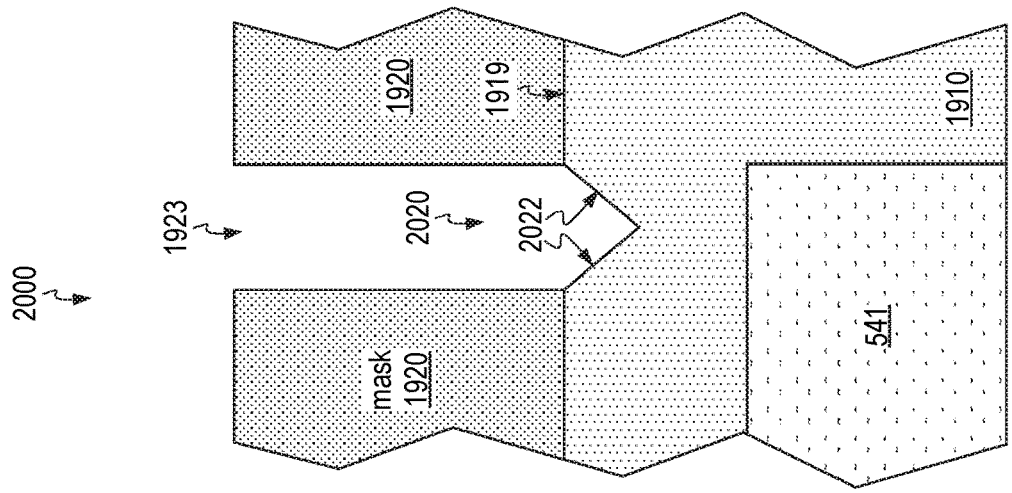

FIG. 20 is a cross-sectional schematic of an intermediate substrate 2000, which is initial substrate 1900 after etching region 1912 to yield a recess 2020 in initial top surface 1919. Recess 2020 has a bottom surface 2022 that is a triangular or V-shaped in a cross-sectional plane that is perpendicular to initial top surface.

Figure 21:
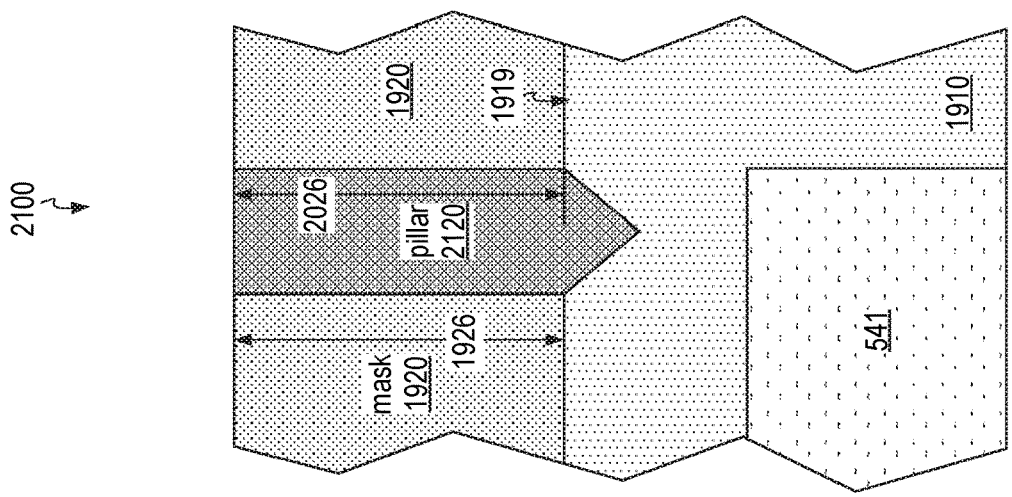
FIGS. 19-26 are schematic cross-sectional views of respective substrates formed in a process to fabricate any of the pointed-trench pixel-array substrates of FIGS. 4-6, 9, and 10, in embodiments.

FIG. 21 is a cross-sectional schematic of an intermediate substrate 2100, which is intermediate substrate 2000 after filling hole 1923 with a sacrificial layer material that forms a pillar 2120 in hole 1923. Examples of sacrificial layer material include photoresist, polyimide, and silicon dioxide. Pillar 2120 has a pillar height 2026 above initial top surface 1919, which in embodiments equals thickness 1926.

Figure 23:
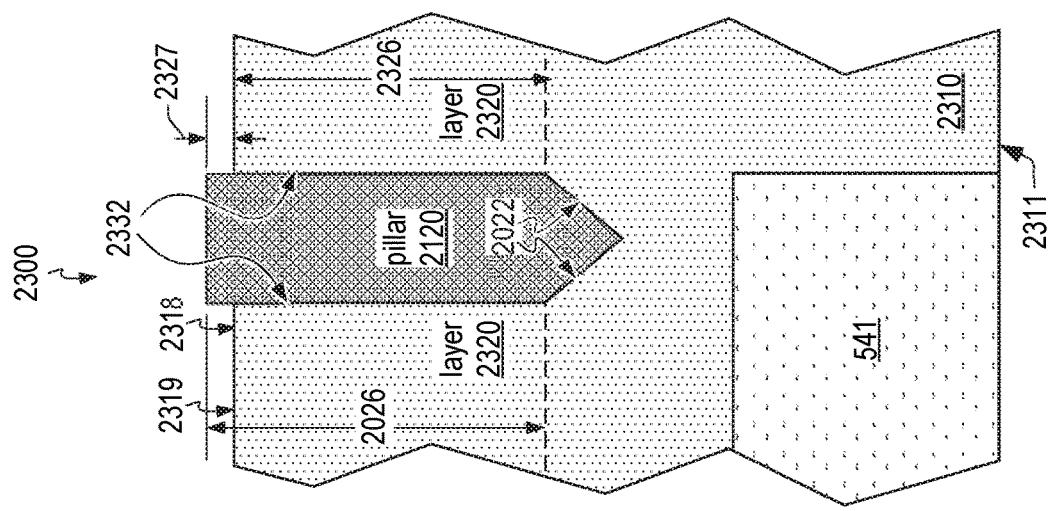
Figure 22:
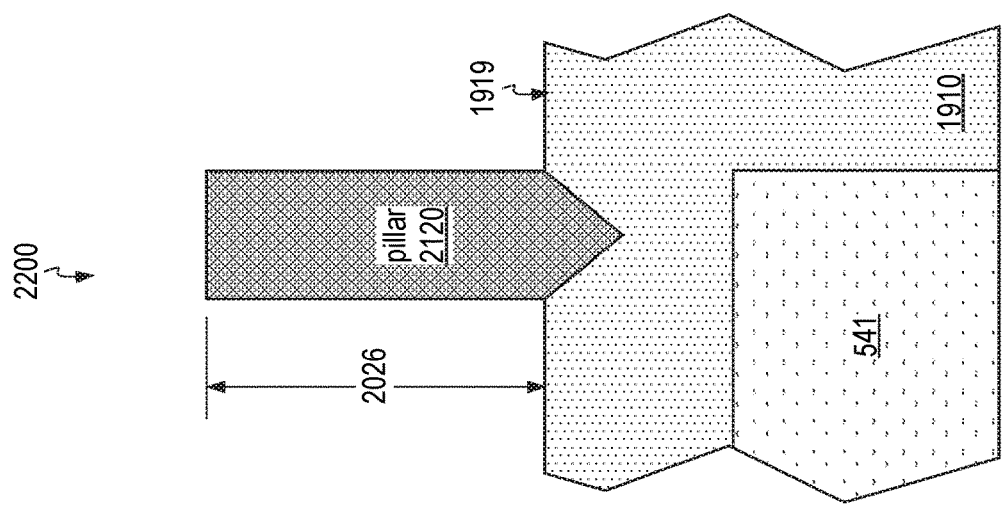

FIG. 22 is a cross-sectional schematic of an intermediate substrate 2200, which is intermediate substrate 2100 after removing the mask layer to yield pillar 2120. FIG. 23 is a cross-sectional schematic of an intermediate substrate 2300, which includes a semiconductor substrate 2310 and pillar 2120. Semiconductor substrate 2310 is semiconductor substrate 1910 after epitaxially forming, on initial top surface 1919, a semiconductor layer 2320. As such, semiconductor substrate 2310 no longer includes surface 1919 as semiconductor layer 2320 is an epitaxial layer thereon. Semiconductor layer 2320 surrounds pillar 2120 and has a layer thickness 2326 that is less than pillar height 2026 by a difference 2327. In embodiments, difference 2327 is between twenty and fifty nanometers.

Figure 24:
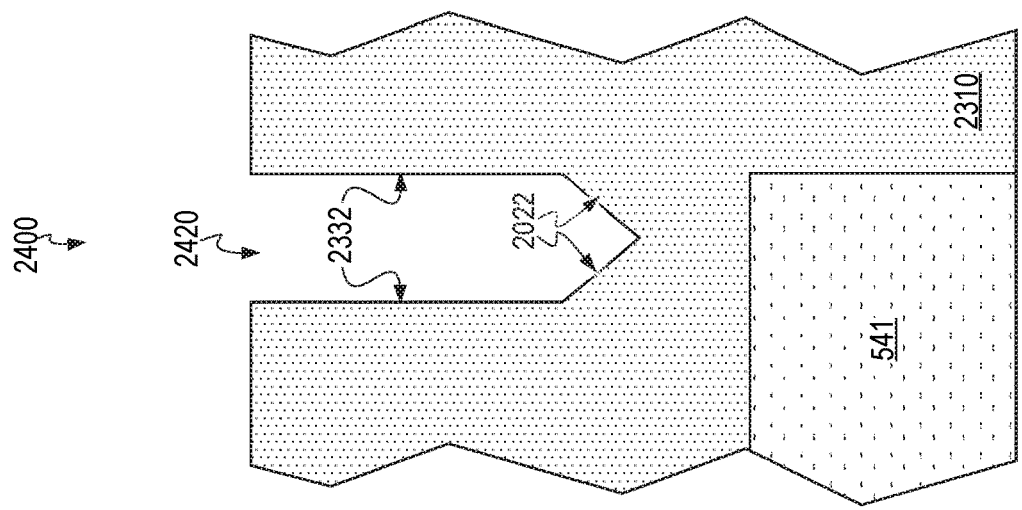

Semiconductor substrate 2310 has a bottom surface 2311, top surface 2319, and therebetween, an interior sidewall surface 2332, and bottom surface 2022. Surfaces 2022 and 2332 define a trench 2420 in semiconductor substrate 2310, as shown in FIG. 24. FIG. 24 is a cross-sectional schematic of an intermediate substrate 2400, which is intermediate substrate 2300 without pillar 2120. Top surface 2319 includes a planar region 2318 that surrounds trench 2420.

Figure 25:
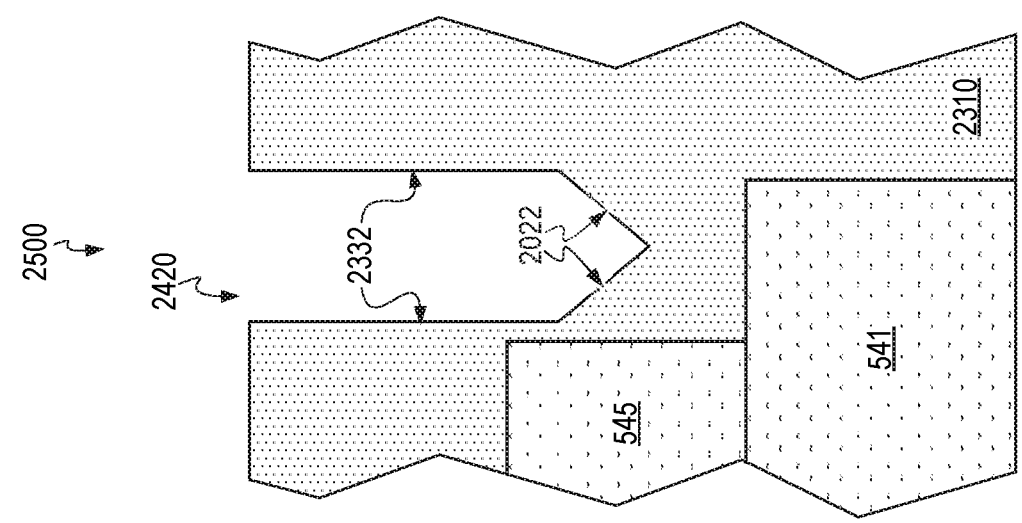

FIG. 25 is a cross-sectional schematic of a pixel-array substrate 2500, which is intermediate substrate 2400 with the addition of photodiode region 545 adjacent to trench 2420. Pixel-array substrate 2500 is an example of pixel-array substrate 500, FIG. 5.

Figure 26:
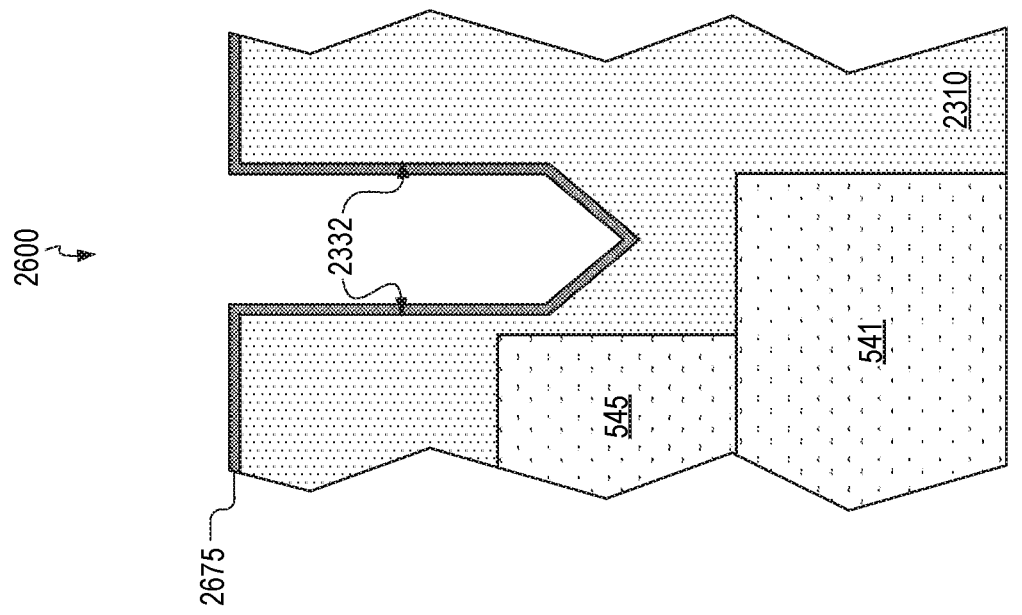

FIG. 26 is a cross-sectional schematic of a pixel-array substrate 2600, which is pixel-array substrate 2500 with the addition of a dielectric layer 2675 on bottom surface 2022, sidewall surface 2332, and part of planar region 2318. In embodiments, pixel-array substrate 2600 includes conductive material 1682 in trench 2420

FIG. 27 is a flowchart illustrating a method 2700 for fabricating a pixel-array substrate, such as any of pointed-trench pixel-array substrates 400, 500, 600, 900, and 1000. Method 2700 includes steps 2710 and 2720. In embodiments, method 2700 also includes at least one of steps 2730, 2740, 2750, 2760, 2770, 1850, 1860, and 1870.

Step 2710 includes forming a hole or an opening in a mask layer formed on an initial top surface of a semiconductor substrate, thereby exposing a region of the initial top surface. The region corresponds to where a trench is formed in subsequent steps for accommodating a vertical transfer gate. In an example of step 2710, hole 1923 is formed in patterned mask 1920 of initial substrate 1900, FIG. 19, for example by a dry etching process.

Step 2720 includes etching the region to yield a recess in the initial top surface, a bottom surface of the recess being V-shaped in a cross-sectional plane that is perpendicular to the initial top surface. In an example of step 2720, region 1912 of intermediate substrate 1900 is etched to yield recess 2020 of intermediate substrate 2000, for example by a wet etching.

Step 2730 includes filling the hole with a sacrificial-layer material. In an example of step 2730, hole 1923 is filled with the sacrificial layer material that forms pillar 2120. Step 2740 includes removing the mask layer to yield a pillar formed of the sacrificial-layer material, protruding from the initial top surface. In an example of step 2740, patterned mask 1920 is removed from intermediate substrate 2100, to yield intermediate substrate 2200, which includes pillar 2120 protruding from initial top surface 1919, as shown in FIG. 22.

Step 2750 includes increasing a thickness of the semiconductor substrate by epitaxially forming, on the initial top surface, a semiconductor layer that surrounds the pillar. The semiconductor layer has a layer thickness less than a pillar height of the pillar above the initial top surface, a top surface of the semiconductor substrate being a top surface of the semiconductor layer. In an example of step 2750, semiconductor layer 2320 is epitaxially formed on initial top surface 1919 of intermediate substrate 2200 to yield intermediate substrate 2300, FIG. 23.

Step 2760 includes removing the pillar to yield a trench extending into the semiconductor substrate away from the top surface. In an example of step 2760, pillar 2120 is removed from intermediate substrate 2300 to yield trench 2420 in intermediate substrate 2400, FIG. 24.

Step 2770 includes forming a photodiode region adjacent to the trench. In an example of step 2770, bottom photodiode region 541 is formed adjacent to trench 2420 of intermediate substrate 2400 to yield pixel-array substrate 2500.

Method 2700 may also include at least one of steps 1850, 1860, and 1870 introduces earlier in an embodiment of method 1800. In an example of step 1850, dielectric layer 2675 is deposited on bottom surface 2022, sidewall surface 2332, and part of planar region 2318 of pixel-array substrate 2500 to yield pixel-array substrate 2600, FIG. 26. In an example of step 1860, conductive material 1682 is deposited in trench 2420 and on part of planar region 2318 of pixel-array substrate 2600 to yield pixel-array substrate 1600, FIG. 16.

Method 2700 may also include deposition of a layer of low-κ dielectric into the trench and on the dielectric layer prior to deposition of conductive material. For example, low-κ dielectric 630 is deposited into the trench onto dielectric layer 2675 prior to the deposition of conductive material.

Figure 28:
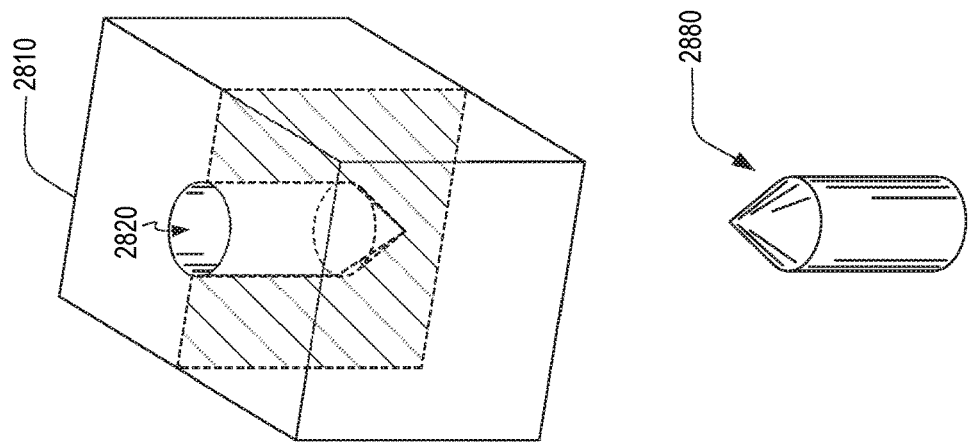

FIG. 28 is an isometric view of a conical trench 2820 formed in a semiconductor substrate 2810. Conical trench 2820 and semiconductor substrate 2810 are respective examples of trench 520 and semiconductor substrate 510. FIG. 28 includes an isometric view of a cone 2880, which represents a cast of conical trench 2820 if conical trench 2820 were used as a mold to form cone 2880.

Figure 29:
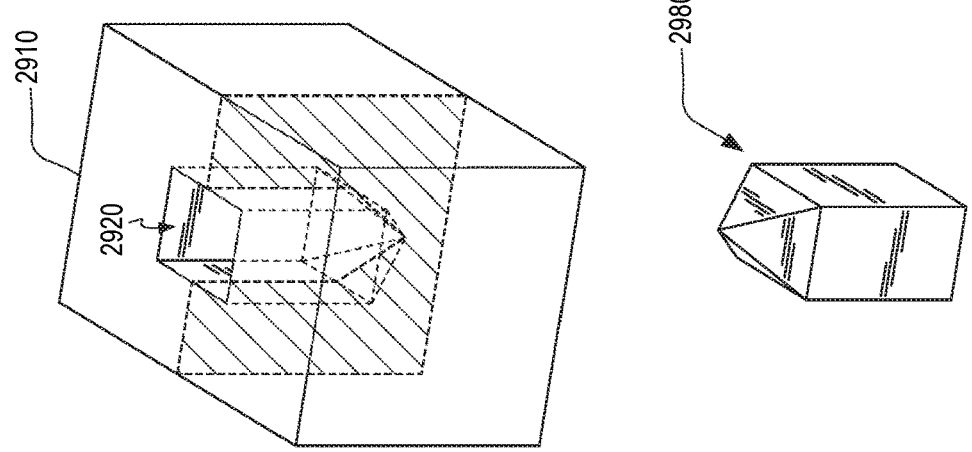

FIG. 29 is an isometric view of an obelisk-shaped trench 2920 formed in a semiconductor substrate 2910. Obelisk-shaped trench 2920 and semiconductor substrate 2910 are respective examples of trench 520 and semiconductor substrate 510. FIG. 29 includes an isometric view of an obelisk 2980, which represents a cast of obelisk-shaped trench 2920 if obelisk-shaped trench 2920 were used as a mold to form obelisk 2980. Sidewalls of obelisk-shaped trench 2920 may be non-tapered, as illustrated, or tapered.

Figure 30:
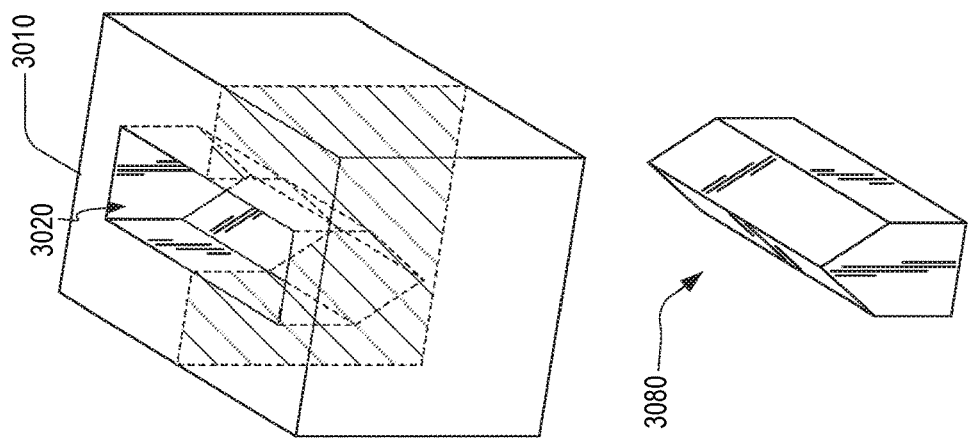
FIGS. 28-30 are respective isometric views of trenches in semiconductor substrates, the trenches representing example shapes of trenches of pointed-trench pixel-array substrates of FIGS. 2 and 4.

FIG. 30 is an isometric view of a pentagonal-prism-shaped trench 3020 formed in a semiconductor substrate 3010. Pentagonal-prism-shaped trench 3020 and semiconductor substrate 3010 are respective examples of trench 520 and semiconductor substrate 510. FIG. 30 includes an isometric view of a pentagonal-prism 3080, which represents a cast of trench 3020 if trench 3020 were used as a mold to form pentagonal-prism 3080.

Combinations of Features:

Features described above as well as those claimed below may be combined in various ways without departing from the scope hereof. The following enumerated examples illustrate some possible, non-limiting combinations:

(A1) A pointed-trench pixel-array substrate includes a floating diffusion region and a photodiode region formed in a semiconductor substrate. The semiconductor substrate includes, between a top surface and a back surface thereof, a sidewall surface and a bottom surface defining a trench extending into the semiconductor substrate away from a planar region of the top surface surrounding the trench. In a cross-sectional plane perpendicular to the top surface and intersecting the floating diffusion region, the photodiode region, and the trench, (i) the bottom surface is V-shaped and (ii) the trench is located between the floating diffusion region and the photodiode region.

(A2) In embodiments of pixel-array substrate (A1), the bottom surface defines a bottom section of the trench, and a depth of the bottom section divided by a width of the trench at the top surface is between 0.6 and 1.4.

(A3) In embodiments of pixel-array substrate (A2), the width of the trench is between 0.05 and 0.3 micrometers.

(A4) In embodiments of any one of pixel-array substrates (A1)-(A3), the bottom surface includes two planar regions each oriented an angle between fifty degrees and seventy degrees with respect to the top surface.

(A5) In embodiments of any one of pixel-array substrates (A1)-(A4), the bottom surface defines a bottom section of the trench. Such embodiments further include (i) a gate dielectric layer on the sidewall surface and the bottom surface, (ii) a low-κ dielectric layer on the bottom surface and having a maximum thickness substantially equal to a depth of the bottom section, and (iii) a gate electrode, disposed in the trench, on the low-κ dielectric layer, and on part of the planar region. A first part of the gate dielectric layer is between the low-κ dielectric layer and the bottom surface. A second part of the gate dielectric layer is between the gate electrode and the sidewall surface.

(A6) In embodiments of any one of pixel-array substrates (A1)-(A5), a maximum distance between and perpendicular to the bottom surface and the top surface defines a trench depth of the trench. The photodiode region includes a bottom photodiode region, part of which is directly beneath the bottom surface, and a top photodiode region. The top photodiode region is adjacent to the trench, between the top surface and the bottom photodiode region, beginning at a photodiode depth that is less than the trench depth, and adjoining the bottom photodiode region, the photodiode depth being relative to the planar region. A distance between the bottom surface and the bottom photodiode region being between zero and thirty nanometers.

(A7) In embodiments of any one of pixel-array substrates (A1)-(A6), the semiconductor substrate also includes, between the top surface and the back surface, an additional sidewall surface and an additional bottom surface defining an additional trench extending into the semiconductor substrate away from the planar region, the additional trench is located between the floating diffusion region and the photodiode region. The additional bottom surface is V-shaped in an additional cross-sectional plane that is perpendicular to the top surface and intersects the floating diffusion region, the photodiode region, and the additional trench. Such embodiments may further include a dielectric layer lining the trench and the additional trench, a gate electrode disposed in the trench, an additional gate electrode disposed in the additional trench, and planar gate electrode, disposed on the top surface, that electrically connects the gate electrode and the additional gate electrode. In embodiments, the gate electrodes, the additional gate electrode, and the planar gate are integrally formed.

(A8) In embodiments of pixel-array substrate (A7), at least part of the planar region being located between the trench and the additional trench.

(A9) In embodiments of any one of pixel-array substrates (A1)-(A8), the bottom surface being mirror-symmetric about an additional cross-sectional plane that is perpendicular to both the cross-sectional plane and the top surface (B1) A method for fabricating a pixel-array substrate includes etching a top surface of a semiconductor substrate to form a sidewall surface and an initial bottom surface of the semiconductor substrate that define a trench in the semiconductor substrate. The method also includes (i) lining the sidewall surface with an oxide layer and (ii) extending a depth of the trench such that a final bottom surface of the trench is V-shaped in a cross-sectional plane that is perpendicular to the top surface.

(B2) In embodiments of method (B1) the sidewall surface extends into the semiconductor substrate away from a planar region of the top surface surrounding the trench to the final bottom surface. Extending the depth further includes isotropically etching the initial bottom surface to remove a volume of the semiconductor substrate therebeneath.

(B3) In embodiments of either one of methods (B1) and (B2) the semiconductor substrate including a bottom photodiode region located in part beneath the final bottom surface, extending the depth further comprising extending the depth until a distance between the final bottom surface and the bottom photodiode region is less than or equal to thirty nanometers (B4) Embodiments of any one of methods (B1)-(B3) further include, after extending the depth, removing the oxide layer.

(B5) Embodiments of method (B4) further include forming a dielectric layer on the final bottom surface, the sidewall surface, and part of a planar region of the top surface surrounding the trench; and depositing a conductive material in the trench and on part of the planar region to form a gate electrode.

(B6) In embodiments of method (B5), the semiconductor substrate includes a top photodiode region beneath the top surface and on a first side of the trench in the cross-sectional plane. The top photodiode region adjoins the bottom photodiode region. Such embodiments may further include forming a floating diffusion region in the semiconductor substrate, the top photodiode region and the floating diffusion region being on opposite sides of the trench in the cross-sectional plane.

(C1) A method for fabricating a pixel-array substrate includes forming a hole in a mask layer formed on an initial top surface of a semiconductor substrate, thereby exposing a region of the initial top surface. The method also includes etching the region to yield a recess in the initial top surface, a bottom surface of the recess being V-shaped in a cross-sectional plane that is perpendicular to the initial top surface.

(C2) Embodiments of method (C1) further include: (i) filling the hole with a sacrificial-layer material; (ii) removing the mask layer to yield a pillar formed of the sacrificial-layer material, protruding from the initial top surface; (iii) increasing a thickness of the semiconductor substrate by epitaxially forming, on the initial top surface, a semiconductor layer that surrounds the pillar and having a layer thickness less than a pillar height of the pillar above the initial top surface, a top surface of the semiconductor substrate being a top surface of the semiconductor layer; and (iv) removing the pillar to yield a trench extending into the semiconductor substrate away from the top surface.

(C3) In embodiments of method (C2), the trench is defined by (i) a sidewall surface of the semiconductor layer adjoining a pillar-sidewall surface of the pillar and (ii) a bottom surface of the semiconductor layer adjoining a pillar-bottom surface of the pillar. Such embodiments may further include (i) forming a dielectric layer on the bottom surface, the sidewall surface, and part of a planar region of the top surface surrounding the trench; and (ii) depositing a conductive material in the trench and on part of the planar region to form a gate electrode.

(C4) In embodiments of either one of methods (C2) and (C3), in the step of epitaxially forming, the pillar height exceeding the layer thickness by between twenty and fifty nanometers.

(C5) Embodiments of any one of methods (C2)-(C4) further include forming a photodiode region adjacent to the trench.

(C6) In embodiments of any one of methods (C2)-(C5), the semiconductor substrate includes a top photodiode region beneath the top surface and on a first side of the trench in the cross-sectional plane. The top photodiode region adjoins the bottom photodiode region. Such embodiments may further include forming a floating diffusion region in the semiconductor substrate, the top photodiode region and the floating diffusion region being on opposite sides of the trench in the cross-sectional plane.

Changes may be made in the above methods and systems without departing from the scope of the present embodiments. It should thus be noted that the matter contained in the above description or shown in the accompanying drawings should be interpreted as illustrative and not in a limiting sense. Herein, and unless otherwise indicated the phrase "in embodiments" is equivalent to the phrase "in certain embodiments," and does not refer to all embodiments. The following claims are intended to cover all generic and specific features described herein, as well as all statements of the scope of the present method and system, which, as a matter of language, might be said to fall therebetween.

What is claimed is:

1. A pixel-array substrate comprising:
a floating diffusion region in a semiconductor substrate;
the semiconductor substrate including a top surface, a back surface opposite the top surface, and between the top surface and the back surface, a sidewall surface and a bottom surface defining a trench extending into the semiconductor substrate away from a planar region of the top surface surrounding the trench; and
a doped region in the semiconductor substrate and including (i) a bottom doped region and (ii) a top doped region adjacent to the trench, between the top surface and the bottom doped region, and beginning at a doped-region depth relative to the planar region and adjoining the bottom doped region;
in a cross-sectional plane perpendicular to the top surface and intersecting the floating diffusion region, the doped region, and the trench, (i) the bottom surface including a first sloped side and a second sloped side that intersect at a vertex such that the bottom surface is V-shaped, the vertex being at a maximum depth of the bottom surface of the trench relative to the planar region of the top surface and (ii) the trench being located between the floating diffusion region and the doped region,
in a direction perpendicular to the bottom surface, (i) a maximum distance between the vertex and the top surface defining a trench depth of the trench that exceeds a minimum depth of the bottom surface, and (ii) the bottom surface spanning between the minimum depth and the maximum distance,
the doped-region depth being less than both the trench depth and the minimum depth of the bottom surface,
the bottom doped region and the top doped region having a same first dopant type.

2. The pixel-array substrate of claim 1, each of the first sloped side and second sloped side being oriented an angle between fifty degrees and seventy degrees with respect to the top surface.

3. The pixel-array substrate of claim 1, the bottom surface defining a bottom section of the trench, and further comprising:
a gate dielectric layer on the sidewall surface and the bottom surface;
a low-κ dielectric layer on the bottom surface and having a maximum thickness substantially equal to a depth of the bottom section, a first part of the gate dielectric layer being between the low-κ dielectric layer and the bottom surface; and
a gate electrode, disposed in the trench, on the low-κ dielectric layer, and on part of the planar region, a second part of the gate dielectric layer being between the gate electrode and the sidewall surface.

4. The pixel-array substrate of claim 1,
part of the bottom doped region being directly beneath the bottom surface;
and
a distance between the bottom surface and the bottom doped region being between zero and thirty nanometers.

5. The pixel-array substrate of claim 1, the semiconductor substrate also including, between the top surface and the back surface,
an additional sidewall surface and an additional bottom surface defining an additional trench extending into the semiconductor substrate away from the planar region, the additional trench being located between the floating diffusion region and the photodiode doped region, and, in the cross-sectional plane, each of the trench and the additional trench being between the top surface and the doped region;
the additional bottom surface being V-shaped in an additional cross-sectional plane that is perpendicular to the top surface and intersects the floating diffusion region, the doped region, and the additional trench; and the pixel-array substrate further comprising:
a dielectric layer lining the trench and the additional trench;
a gate electrode disposed in the trench;
an additional gate electrode disposed in the additional trench; and
a planar gate electrode, disposed on the top surface, that electrically connects the gate electrode and the additional gate electrode.

6. The pixel-array substrate of claim 5, the planar gate electrode, the gate electrode and the additional gate electrode being integrally formed.

7. The pixel-array substrate of claim 1, the bottom surface being mirror-symmetric about an additional cross-sectional plane that includes the vertex and is perpendicular to both the cross-sectional plane and the top surface.

8. The pixel-array substrate of claim 1,
wherein, in the cross-sectional plane and at the minimum depth, the sidewall surface (i) adjoins the bottom surface, and (ii) is not parallel to either of the first sloped side and the second sloped side.

9. The pixel-array substrate of claim 8, part of the bottom doped region being between the bottom surface and the back surface.

10. The pixel-array substrate of claim 1,
the bottom surface and the sidewall surface defining a top section and a bottom section, respectively,
the top section extending to a first depth with respect to the planar region has a first width throughout the first depth;
the bottom section extending from the first depth to the maximum depth, and has a second width that decreases toward the maximum depth.

11. The pixel-array substrate of claim 1, the top doped region continuously adjoining the bottom doped region such that, in the cross-sectional plane and along a direction perpendicular to the top surface, all regions of the semiconductor substrate located between the top doped region and the bottom doped region are of the first dopant type.

* * * * *